US012620554B2

(12) United States Patent
Luan et al.

(10) Patent No.: US 12,620,554 B2
(45) Date of Patent: May 5, 2026

(54) PLASMA PROCESSING WITH PHASE-LOCKED WAVEFORMS

(71) Applicant: Tokyo Electron Limited, Tokyo (JP)

(72) Inventors: Pingshan Luan, Albany, NY (US); Minjoon Park, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 77 days.

(21) Appl. No.: 18/516,562

(22) Filed: Nov. 21, 2023

(65) Prior Publication Data

US 2025/0166966 A1 May 22, 2025

(51) Int. Cl.
*H01J 37/32* (2006.01)

(52) U.S. Cl.
CPC .............................. *H01J 37/32146* (2013.01)

(58) Field of Classification Search
CPC .......... H01J 37/32146; H01J 37/32174; H01J 2237/334; H01J 37/32091; H01J 37/32183; H01J 37/32706
See application file for complete search history.

(56) References Cited

U.S. PATENT DOCUMENTS

| | | | |
|---|---|---|---|
| 4,863,549 | A | 9/1989 | Grunwald |
| 5,304,282 | A | 4/1994 | Flamm |
| 5,928,528 | A | 7/1999 | Kubota et al. |
| 8,735,291 | B2 | 5/2014 | Ranjan et al. |
| 9,159,575 | B2 | 10/2015 | Ranjan et al. |
| 9,257,294 | B2 | 2/2016 | Rueger |

| | | | | |
|---|---|---|---|---|
| 9,514,967 | B2 * | 12/2016 | Ohgoshi | ........... H01J 37/32146 |
| 9,570,313 | B2 | 2/2017 | Ranjan et al. | |
| 9,583,357 | B1 | 2/2017 | Long et al. | |
| 9,726,621 | B1 | 8/2017 | Bahr | |
| 9,788,405 | B2 * | 10/2017 | Kawasaki | ........ H01J 37/32146 |
| 9,831,064 | B2 | 11/2017 | Konno et al. | |

(Continued)

FOREIGN PATENT DOCUMENTS

| | | |
|---|---|---|
| CN | 1363721 A | 8/2002 |
| CN | 1619011 A | 5/2005 |

(Continued)

OTHER PUBLICATIONS

Carter, G. et al., "Chapter 3: Secondary Electron Emission," Ion Bombardment of Solids, Jun. 1, 1968, 19 pages, American Elsevier Publishing Company, Inc., New York, United States of America.

(Continued)

*Primary Examiner* — Wei (Victor) Y Chan
(74) *Attorney, Agent, or Firm* — Slater Matsil, LLP

(57) ABSTRACT

A plasma processing method includes applying AC waveforms to a bottom electrode in a plasma chamber to generate a plasma. The method further includes applying a first pulse train including a first plurality of DC pulses to a top electrode in the plasma chamber, where each DC pulse of the first plurality of DC pulses includes a first on-state and a first off-state. And the method further includes applying a second pulse train including a second plurality of DC pulses to the bottom electrode in the plasma chamber, and where each DC pulse of the second plurality of DC pulses includes a second on-state and a second off-state, the first pulse train being offset in phase relative to the second pulse train so that each first off-state overlaps with each second on-state.

20 Claims, 11 Drawing Sheets

(56) References Cited

U.S. PATENT DOCUMENTS

| | | | |
|---|---|---|---|
| 9,870,898 | B2 | 1/2018 | Urakawa et al. |
| 10,755,895 | B2 | 8/2020 | Marakhtanov et al. |
| 10,998,169 | B2 | 5/2021 | Ventzek et al. |
| 11,282,678 | B2 | 3/2022 | Na |
| 11,545,364 | B2 | 1/2023 | Ventzek et al. |
| 12,183,583 | B2 * | 12/2024 | Ventzek ............... H01J 37/3244 |
| 2001/0051438 | A1 | 12/2001 | Shin et al. |
| 2002/0115301 | A1 | 8/2002 | Savas |
| 2002/0160125 | A1 | 10/2002 | Johnson et al. |
| 2003/0070759 | A1 | 4/2003 | Aota et al. |
| 2005/0103623 | A1 | 5/2005 | Tolmachev et al. |
| 2006/0121704 | A1 | 6/2006 | Walther et al. |
| 2008/0023443 | A1 | 1/2008 | Paterson |
| 2008/0317965 | A1 | 12/2008 | Son et al. |
| 2009/0207537 | A1 | 8/2009 | Coumou |
| 2009/0255800 | A1 | 10/2009 | Koshimizu |
| 2009/0294062 | A1 | 12/2009 | Shannon et al. |
| 2010/0130018 | A1 | 5/2010 | Tokashiki et al. |
| 2010/0243607 | A1 | 9/2010 | Ohse et al. |
| 2010/0248488 | A1 | 9/2010 | Agarwal et al. |
| 2010/0273332 | A1 | 10/2010 | Edelberg |
| 2010/0315064 | A1 | 12/2010 | Kuthi et al. |
| 2011/0139748 | A1 | 6/2011 | Donnelly et al. |
| 2011/0143537 | A1 | 6/2011 | Lee et al. |
| 2013/0059448 | A1 * | 3/2013 | Marakhtanov .... H01J 37/32146 |
| | | | 438/711 |
| 2013/0105443 | A1 | 5/2013 | Banna et al. |
| 2013/0222055 | A1 | 8/2013 | Coumou et al. |
| 2014/0118031 | A1 | 5/2014 | Rughoonundon et al. |
| 2014/0262755 | A1 | 9/2014 | Deshmukh et al. |
| 2014/0263182 | A1 | 9/2014 | Chen et al. |
| 2014/0273487 | A1 | 9/2014 | Deshmukh et al. |
| 2015/0076112 | A1 | 3/2015 | Sriraman et al. |
| 2017/0098527 | A1 | 4/2017 | Kawasaki et al. |
| 2017/0099722 | A1 * | 4/2017 | Kawasaki ......... H01J 37/32174 |
| 2017/0103873 | A1 | 4/2017 | Kawasaki |
| 2017/0186586 | A1 | 6/2017 | Oh et al. |
| 2017/0229312 | A1 | 8/2017 | Park et al. |
| 2017/0365445 | A1 | 12/2017 | Kubota |
| 2020/0058469 | A1 * | 2/2020 | Ranjan .............. H01L 21/67069 |
| 2020/0058470 | A1 * | 2/2020 | Ventzek ............ C23C 16/45536 |
| 2021/0398777 | A1 | 12/2021 | Shiina et al. |

FOREIGN PATENT DOCUMENTS

| | | | |
|---|---|---|---|
| CN | 1983351 | A | 6/2007 |
| CN | 101843178 | A | 9/2010 |
| CN | 102024658 | A | 4/2011 |
| CN | 103903949 | A | 7/2014 |
| CN | 103915308 | A | 7/2014 |
| CN | 104465291 | A | 3/2015 |
| CN | 104465296 | A | 3/2015 |
| CN | 104733278 | A | 6/2015 |
| CN | 106449396 | A | 2/2017 |
| CN | 106920734 | A | 7/2017 |
| CN | 107039263 | A | 8/2017 |
| JP | 199608045903 | A | 2/1996 |
| JP | 2001322534 | A | 11/2001 |
| JP | 2001358129 | A | 12/2001 |
| JP | 2016511551 | A | 4/2016 |
| JP | 2017069542 | A | 4/2017 |
| KR | 890006845 | A | 6/1989 |
| KR | 20120027159 | A | 3/2012 |
| KR | 101703366 | B1 | 2/2017 |
| KR | 20200086808 | A | 7/2020 |
| TW | 201108871 | A | 3/2011 |
| TW | I374271 | B | 10/2012 |
| TW | 201533797 | A | 9/2015 |
| TW | 201643956 | A | 12/2016 |
| TW | I584700 | B | 5/2017 |
| TW | 201722213 | A | 6/2017 |
| TW | 201724920 | A | 7/2017 |
| TW | I604498 | B | 11/2017 |
| TW | 201810419 | A | 3/2018 |
| WO | 2014159144 | A1 | 10/2014 |

OTHER PUBLICATIONS

Keller, J., "Inductive plasmas for plasma processing," Plasma Sources Sci. Technol. 5 (1996) 166-172, IOP Publishing Ltd, in final form Feb. 8, 1996, 7 pages.

Keller, J., "New and possible future trends in inductively coupled plasmas (ICPs) for semiconductor processing," Plasma Phys. Control. Fusion 39 (1997) A437-A443, IOP Publishing Ltd, May 1997, 7 pages.

Niazi, K. et al., "Operation of a helical resonator plasma source," Plasma Sources Sci. Technol. 3 (1994) 482-495, IOP Publishing Ltd, in final form Feb. 17, 1994, 15 pages.

Tokashiki, K. et al., "Synchronous Pulse Plasma Operation upon Source and Bias Radio Frequencys for Inductively Coupled Plasma for Highly Reliable Gate Etching Technology," Japanese Journal of Applied Physics 48 (2009) 08HD01, Aug. 20, 2009, 11 pages.

Piejak, R. et al., "A simple analysis of an inductive RF discharge," Plasma Sources Sci. Technol. 1 (1992) 179-186, IOP Publishing, in final form Jul. 17, 1992, 8 pages.

Banna, S. et al. "Inductively Coupled Pulsed Plasmas in the Presence of Synchronous Pulsed Substrate Bias for Robust, Reliable, and Fine Conductor Etching," IEEE Transactions on Plasma Science, vol. 37, No. 9, Sep. 2009, 17 pages.

International Searching Authority, "Notification of Transmittal of the International Search Report and the Written Opinion of the International Searching Authority, or the Declaration," PCT/US2024/ 047301, Mailed Dec. 23, 2024, 9 pages.

* cited by examiner

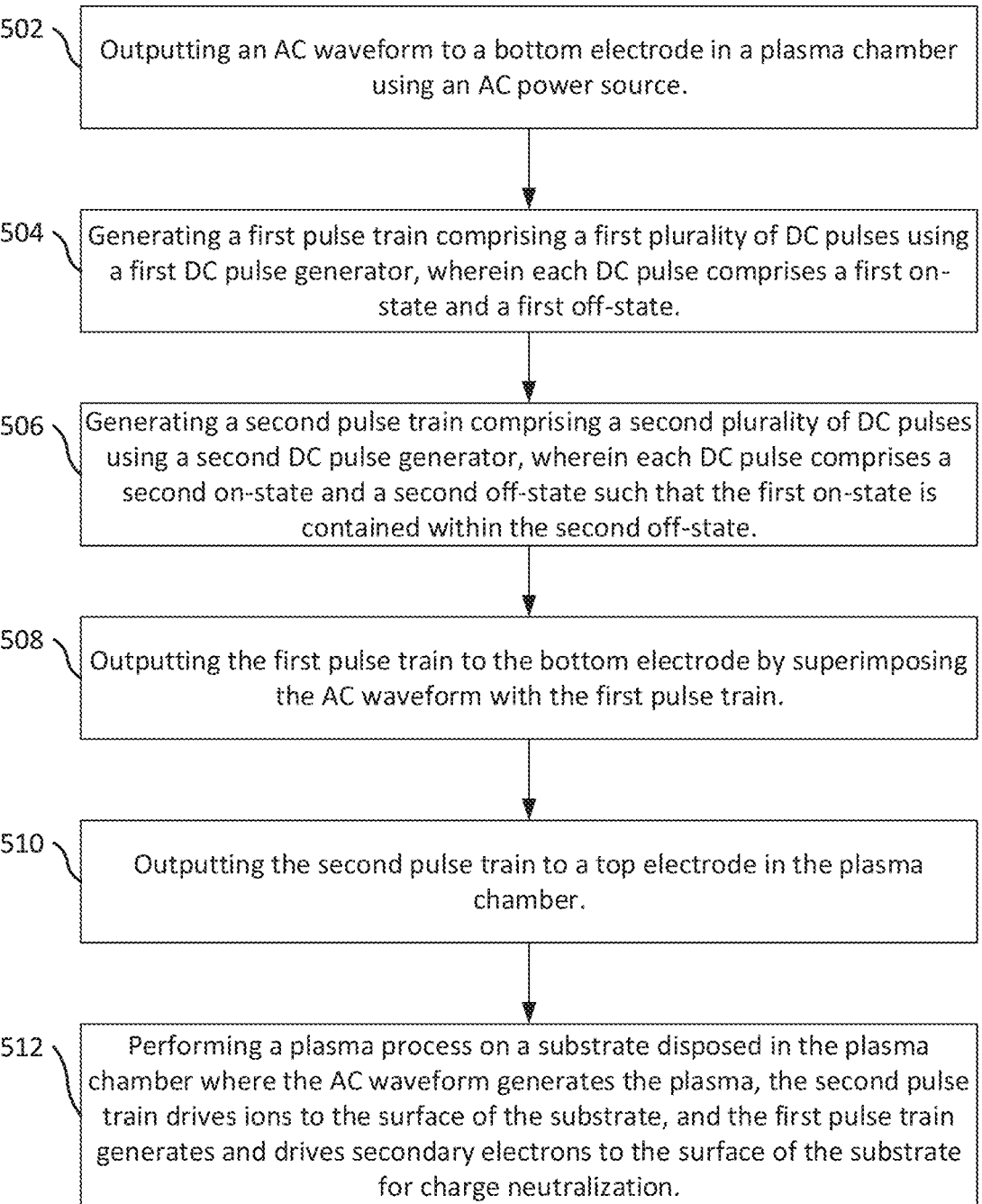

502 — Outputting an AC waveform to a bottom electrode in a plasma chamber using an AC power source.

504 — Generating a first pulse train comprising a first plurality of DC pulses using a first DC pulse generator, wherein each DC pulse comprises a first on-state and a first off-state.

506 — Generating a second pulse train comprising a second plurality of DC pulses using a second DC pulse generator, wherein each DC pulse comprises a second on-state and a second off-state such that the first on-state is contained within the second off-state.

508 — Outputting the first pulse train to the bottom electrode by superimposing the AC waveform with the first pulse train.

510 — Outputting the second pulse train to a top electrode in the plasma chamber.

512 — Performing a plasma process on a substrate disposed in the plasma chamber where the AC waveform generates the plasma, the second pulse train drives ions to the surface of the substrate, and the first pulse train generates and drives secondary electrons to the surface of the substrate for charge neutralization.

*Fig. 5*

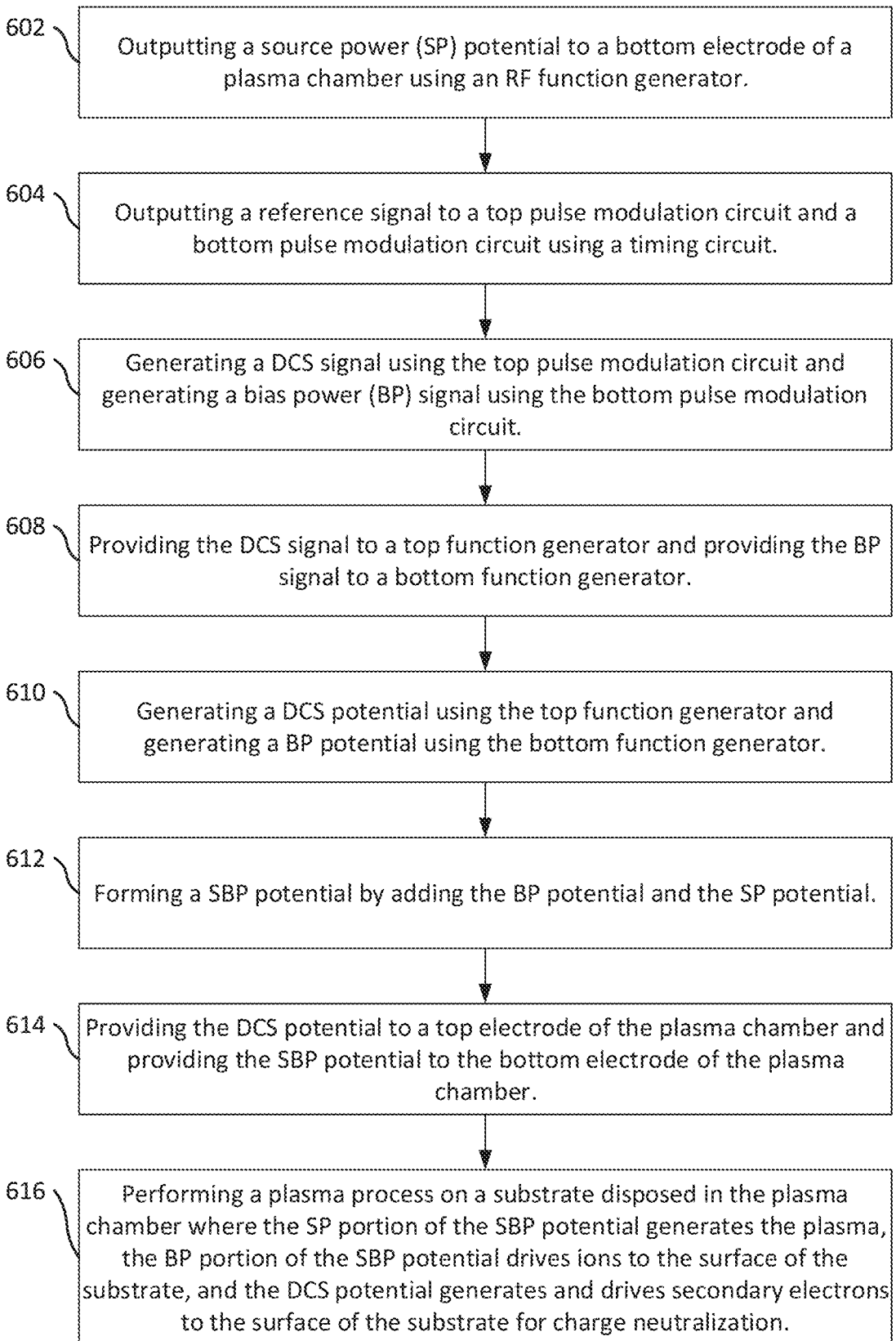

602 — Outputting a source power (SP) potential to a bottom electrode of a plasma chamber using an RF function generator.

604 — Outputting a reference signal to a top pulse modulation circuit and a bottom pulse modulation circuit using a timing circuit.

606 — Generating a DCS signal using the top pulse modulation circuit and generating a bias power (BP) signal using the bottom pulse modulation circuit.

608 — Providing the DCS signal to a top function generator and providing the BP signal to a bottom function generator.

610 — Generating a DCS potential using the top function generator and generating a BP potential using the bottom function generator.

612 — Forming a SBP potential by adding the BP potential and the SP potential.

614 — Providing the DCS potential to a top electrode of the plasma chamber and providing the SBP potential to the bottom electrode of the plasma chamber.

616 — Performing a plasma process on a substrate disposed in the plasma chamber where the SP portion of the SBP potential generates the plasma, the BP portion of the SBP potential drives ions to the surface of the substrate, and the DCS potential generates and drives secondary electrons to the surface of the substrate for charge neutralization.

*Fig. 6*

PLASMA PROCESSING WITH PHASE-LOCKED WAVEFORMS

TECHNICAL FIELD

The present invention relates generally to plasma processing, and, in particular embodiments, to systems and methods relating to plasma processing with phase-locked waveforms.

BACKGROUND

Plasma processing plays a pivotal role in numerous industrial and scientific applications, ranging from semiconductor device manufacturing to thin film deposition, surface cleaning, etching, and materials synthesis. The ability to precisely control the characteristics of the plasma discharge is critical for achieving desired outcomes in these processes.

Conventional plasma processing systems typically employ sinusoidal or pulse-width modulated sinusoidal waveforms to sustain and manipulate plasma. While these methods have proven effective to some extent, they suffer from limitations in terms of precise control over plasma parameters, including ion energy distribution, electron temperature, and density uniformity. These limitations can result in non-uniform processing, reduced yield, and increased production costs.

To address these challenges, recent advancements in plasma processing have explored the use of non-sinusoidal waveforms, such as square waves and other pulsed waveforms, to achieve better control and performance. However, these approaches often complicate the process development with many additional degrees of freedom, limiting their implementation in the fast-paced processing design environments.

SUMMARY

A plasma processing method includes applying AC waveforms to a bottom electrode in a plasma chamber to generate a plasma. The method further includes applying a first pulse train including a first plurality of DC pulses to a top electrode in the plasma chamber, where each DC pulse of the first plurality of DC pulses includes a first on-state and a first off-state. And the method further includes applying a second pulse train including a second plurality of DC pulses to the bottom electrode in the plasma chamber, and where each DC pulse of the second plurality of DC pulses includes a second on-state and a second off-state, the first pulse train being offset in phase relative to the second pulse train so that each first off-state overlaps with each second on-state.

A plasma processing method includes providing a first pulse train including a first plurality of DC pulses to a top electrode in a plasma chamber. And the plasma processing method further includes providing AC waveforms and a second pulse train including a second plurality of DC pulses to a bottom electrode in the plasma chamber, where a second time duration that is the length of time of each of the on-states of the DC pulses of the second plurality of DC pulses is contained within the off time duration that is the length of time of each of the off-states of the DC pulses of the first plurality of DC pulses such that the off-states of the first pulse train align with the on-states of the second pulse train.

A plasma processing system includes a plasma chamber, a top electrode and a bottom electrode, a first DC pulse generator coupled to the top electrode and configured to generate a first pulse train, and a second DC pulse generator coupled to the bottom electrode and configured to generate a second pulse train. The plasma processing system further includes a function generator coupled to the bottom electrode and configured to generate an AC waveform. And the plasma processing system further includes a controller coupled to and configured to control the outputs of the first DC pulse generator, the second DC pulse generator, and the function generator, the controller being configured to phase lock the first pulse train with the second pulse train.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 illustrates an example method of plasma processing in accordance with an embodiment of the invention; and FIG. 6 illustrates an example method of plasma processing in accordance with an embodiment of the invention.

DETAILED DESCRIPTION OF ILLUSTRATIVE EMBODIMENTS

Figure 1A:
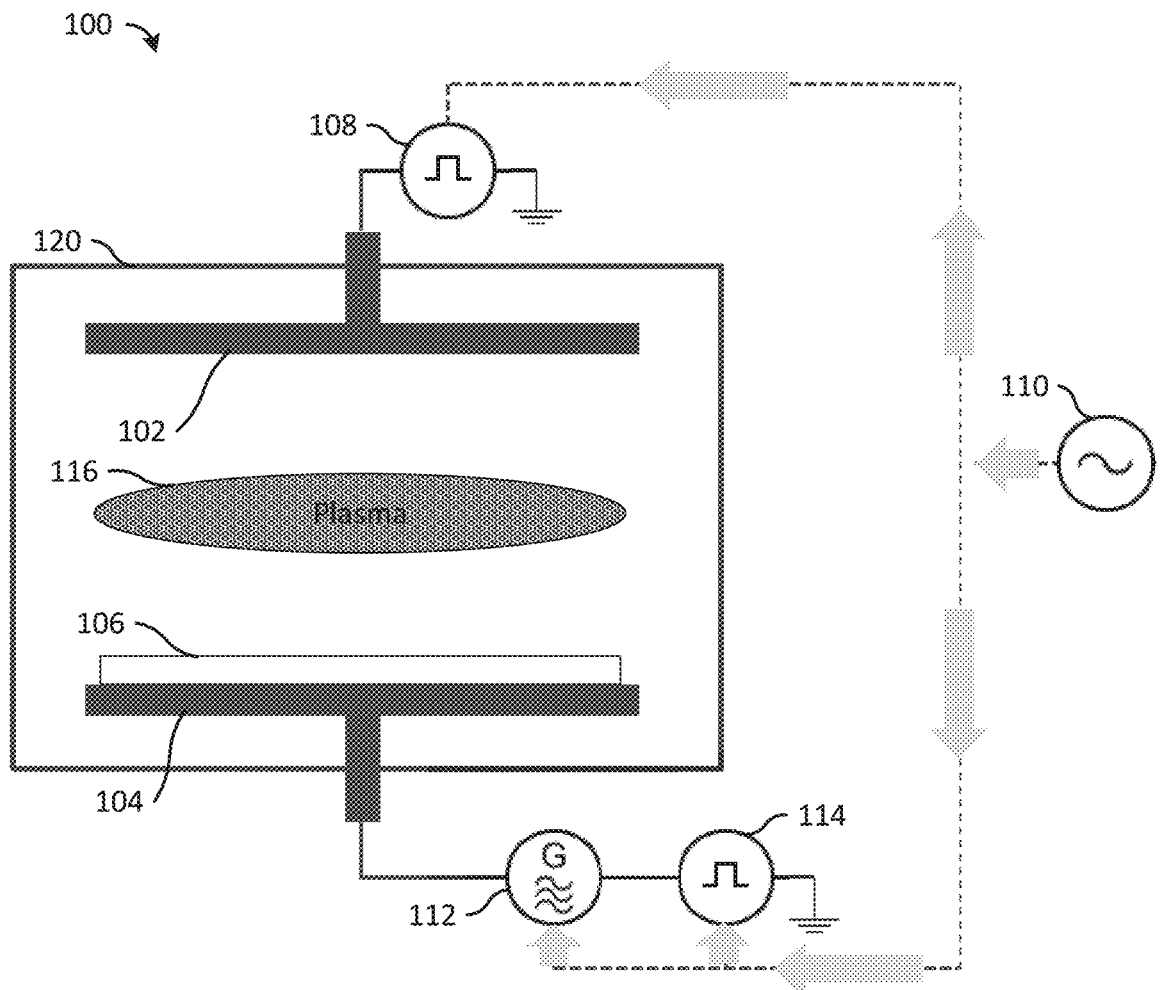
FIG. 1A illustrates a schematic diagram of a plasma processing system using a method of biasing a top electrode and a bottom electrode in an embodiment using a reference clock.

A challenge faced by current anisotropic plasma etch processes is the differential charging of etch features. In anisotropic plasma etch processes, differential charging inside of etch features, especially high aspect ratio contact (HARC) structures, is undesirable. Differential charging inside of etch features may lead to profile defects such as distortion, tilting, and contact edge roughness. The top electrode of current generation capacitively-coupled plasma (CCP) chambers have either no DC bias or continuous DC bias for generating ballistic electrons. The emitted ballistic electrons may carry high energy and consequently transport deep into the HARC structures for neutralizing some of the positive charges caused by ion flux and mitigating differential charging. However, a challenge resulting from applying continuous DC bias on the top electrode is the continuous sputtering of top electrode material. When continuous DC bias is applied, the heavy ions from plasma constantly bombard the top electrode, which can lead to material consumption on the top electrode and particle issues in the chamber.

In a conventional top electrode direct current superposition (DCS) scheme, in addition to the high frequency radio frequency (RF, MHz range) waveforms applied to a bottom electrode to power the plasma, either a low frequency (kHz range) sinusoidal or rectangular waveform are superimposed on the high frequency RF waveform and are applied to the bottom electrode to control processing with the plasma (such as etching). The conventional DCS scheme biases the top electrode using a continuous DC bias.

This disclosure details a plasma processing method and system incorporating a novel power coupling scheme for CCP chambers where both the top electrode and the bottom electrode are powered by phase-locked pulses, e.g., rectangular waveforms. Both DC waveforms have the same frequency in kHz range, but are reversed in phase causing the bias of the top electrode to be zero when the bias of the bottom electrode is non-zero, and vice versa in some embodiments. In this arrangement, the top electrode has zero potential when a wafer on the bottom electrode is biased to a large negative value, which may be called the DC voltage off-phase. During the DC voltage off-phase, the ions in a plasma are driven by the large potential drop through a sheath on the wafer surface (to etch), and the ions delivered onto the top electrode are significantly less energetic. As a result, sputtering of the top electrode and foreign material deposition on the wafer are both reduced. In the same arrangement, when the top electrode is biased to a negative value, the wafer on the bottom electrode has zero potential, which may be called the DC voltage on-phase. During the DC voltage on-phase, secondary electrons are released from the top electrode and are then accelerated through the large DC sheath (e.g. −1 kV). These secondary electrons can be transported anisotropically onto the wafer surface without the presence of the actively applied DC voltage (e.g. −7 kV) which may repel ballistic electrons back into the plasma bulk. As a result, positive charges inside HARC features are more efficiently neutralized, thus diminishing differential charging effects.

Embodiments of the disclosure are described in the context of the accompanying drawings. Embodiments of a plasma processing system will be described using FIGS. 1A-1B. Various embodiments of the phase-locked rectangular waveforms used as a bias power (BP) pulse train on the top electrode and the bottom electrode, as well as a superimposed AC waveform used as a source power (SP) potential on the bottom electrode will be described using FIGS. 2A-2D. One period of a plasma processing method will be described using FIGS. 3A-3B. A block diagram of an embodiment of the plasma processing system of this disclosure will be described using FIG. 4. And two plasma processing methods will be described using FIG. 5 and FIG. 6.

Figure 1B:
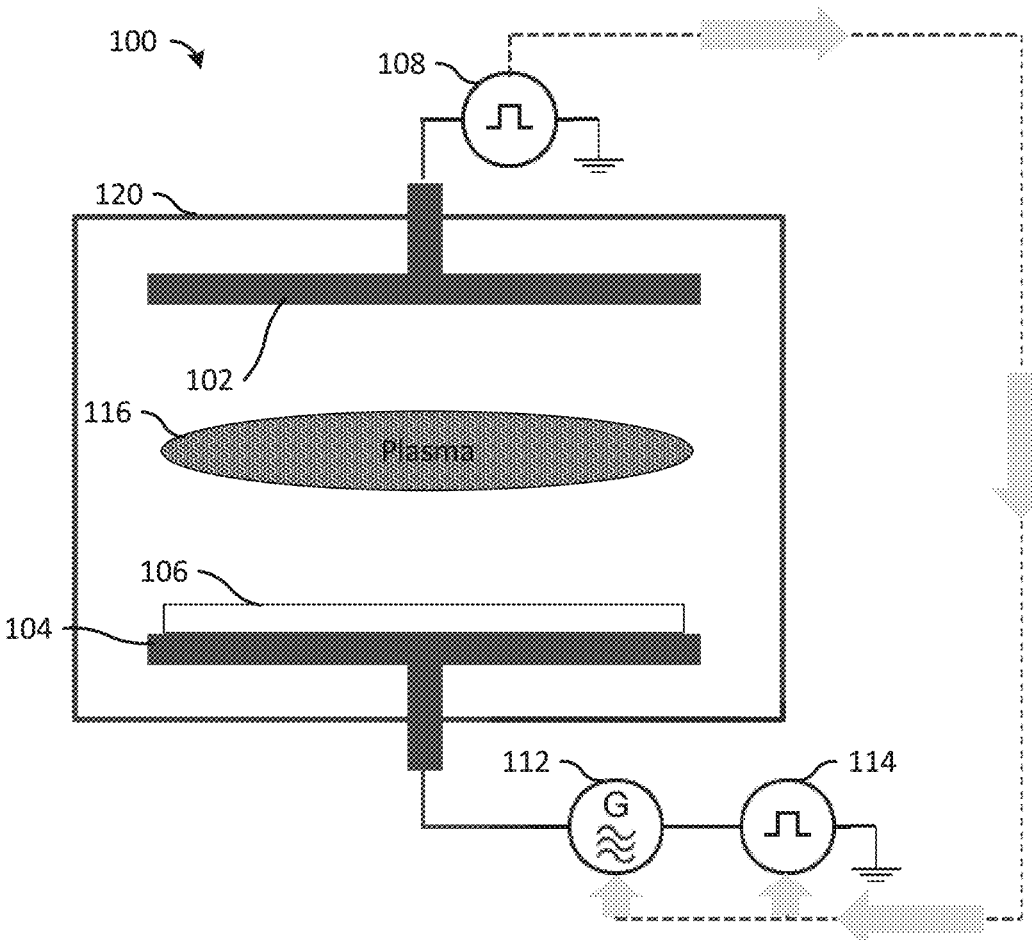
FIG. 1B illustrates a schematic diagram of a plasma processing system using a method of biasing a top electrode and a bottom electrode in an embodiment using the bias of the top electrode as a reference for triggering the bias of the bottom electrode.

FIGS. 1A-1B illustrate two embodiments of a plasma processing system capable of using the plasma processing method of this disclosure.

FIG. 1A illustrates a schematic diagram of a plasma processing system 100 capable of implementing the plasma processing method of this disclosure in an embodiment using a reference clock 110 to phase-lock the rectangular waveforms used for operating the plasma processing system 100. The plasma processing system 100 may be a capacitively-coupled plasma (CCP) processing system and generate a capacitively-coupled plasma (CCP) for processing. The plasma processing system 100 comprises a plasma chamber 120 which may be coupled with a first DC pulse generator 108, the reference clock 110, a second DC pulse generator 114, and an AC power source 112. The plasma chamber 120 comprises a top electrode 102, and a bottom electrode 104 opposite of the top electrode 102. Disposed within the plasma chamber 120 may be a substrate 106 on the bottom electrode 104, and a plasma 116 which may be used for processing the substrate 106. The bottom electrode 104 may comprise additional components such as a chuck or other clamping mechanism for holding the substrate 106.

In the embodiment illustrated in FIG. 1A, the top electrode 102 may be electrically coupled with the first DC pulse generator 108. The bottom electrode 104 may be electrically coupled with the AC power source 112, which may be electrically coupled with the second DC pulse generator 114. The first DC pulse generator 108, the second DC pulse generator 114, and the AC power source 112 may all be electrically coupled with the reference clock 110, which enables the first DC pulse generator 108 and the second DC pulse generator 114 to produce rectangular waveforms (pulsed DC biases) which are phase-locked (e.g., the DC waveforms illustrated in FIGS. 2A-2D). Phase-locked, when used in this disclosure, references the alignment of the off-phases of a first rectangular waveform with the on-phase of a second rectangular waveform, with or without a fixed skew. For example, when the pulse widths of the off-phases of the first rectangular waveform align with the pulse widths of the on-phases of the second rectangular waveform, the first and second rectangular waveforms are examples of a type of phase-locked rectangular waveforms. In other examples, phase-locked rectangular waveforms may have a different phase relationship.

The AC power source 112 may be any suitable power source, such as an RF power supply or a function generator with power amplifiers, capable of providing AC waveforms (e.g., a sine wave) at an appropriate frequency to the bottom electrode 104 to generate the plasma 116, such as frequencies of 2 MHz, 13.56 MHz, 27 MHz, and 60 MHz. The AC power source 112 may provide AC waveforms continuously during processing of the substrate 106 for maintaining plasma density or other parameters of the plasma 116. The AC power source 112 provides the AC waveforms to excite a process gas in the gap between the top electrode 102 and the bottom electrode 104 to produce the plasma 116. In various embodiments the AC waveforms provided by the AC power source 112 to the bottom electrode 104 during processing may be illustrated by the AC waveforms illustrated in FIGS. 2A-2D. The AC waveforms (also called a source power (SP) potential) may be characterized by a SP frequency, a SP pulse width, and a SP amplitude.

The first DC pulse generator 108, illustrated in FIG. 1A, may be configured to apply a first pulsed DC bias (called a DCS potential) to the top electrode 102. The second DC pulse generator 114, illustrated in FIG. 1A, may be configured to apply a second pulsed DC bias (called a bias power (BP) potential) to the bottom electrode 104. The first pulsed DC bias comprises rectangular waveforms characterized by a first frequency, a first pulse width, a first amplitude, and a first duty cycle. The second pulsed DC bias comprises rectangular waveforms characterized by a second frequency, a second pulse width, a second amplitude, and a second duty cycle. In the embodiment illustrated in FIG. 1A, the first DC pulse generator 108 and the second DC pulse generator 114 may be coupled with the reference clock 110 to result in the first pulsed DC bias and the second pulsed DC bias being phase-locked through the use of the same reference signal from the reference clock 110. The phase-locked rectangular waveforms have the same frequency, but may have different duty cycles and amplitudes, and may be illustrated as any of the DC waveforms illustrated in FIGS. 2A-2D in accordance with various embodiments. Various embodiments may use different frequencies for the DCS potential and BP potential, and SP potential waveforms, such as $f_{DCS}=f_{BP}=50$ kHz to 1000 kHz, $f_{SP}=1$ MHz to 100 MHz.

In various embodiments, the first DC pulse generator 108 and second DC pulse generator 114 may be any device capable of producing rectangular waveforms of predetermined amplitude, frequency, pulse width, and duty cycle. For example, the first DC pulse generator 108 and second DC pulse generator 114 may be function generators outputting square waves resembling the DC waveforms illustrated in FIGS. 2A-2D. As another example, the first DC pulse generator 108 and second DC pulse generator 114 may be implemented as a system of electrical components, such as the embodiment illustrated in FIG. 4.

In an embodiment where the plasma processing system 100 is using the plasma processing method of this disclosure, the first DC pulse generator 108 produces the first pulsed DC bias on the top electrode 102. During an on-phase of the first pulsed DC bias, secondary electrons are produced from collisions of ions from the plasma 116 with the top electrode 102. These secondary electrons are repelled by the negative bias of the top electrode 102 by the first pulsed DC bias on-phase, and are driven to the substrate 106 because the on-phase of the first pulsed DC bias corresponds to the off-phase of the second pulsed DC bias applied to the bottom electrode 104. Because there is no large negative bias potential on the bottom electrode 104 during the on-phase of the first pulsed DC bias on the top electrode 102, these energetic secondary electrons may travel to the substrate 106 anisotropically without being repelled by a large negative bias potential. Once at the substrate 106, the energetic electrons mitigate (or neutralize) the positive charge build up in HARC features being etched on the substrate 106, which is a benefit of this disclosure.

In the same embodiment where the plasma processing system 100 is using the plasma processing method of this disclosure, the second DC pulse generator 114 produces the second pulsed DC bias on the bottom electrode 104. During an on-phase of the second pulsed DC bias, the positive ions from the plasma 116 are accelerated to the surface of the substrate 106. These positive ions may be used for processing the substrate 106 by driving them through a large sheath above the surface of the substrate 106 using the large negative bias of the bottom electrode 104. During the on-phase of the second pulsed DC bias, the first pulsed DC bias is in an off-phase, thus reducing the energy of positive ions driven to the top electrode 102 during this phase. As a result, sputtering of the top electrode 102 is significantly reduced in comparison to conventional methods, which is another benefit of this disclosure.

The behavior of the plasma processing system 100 using the plasma processing method of this disclosure will be further described using FIGS. 3A-3B below.

In a different embodiment, the plasma processing system 100 may be configured in the manner illustrated in FIG. 1B. Instead of using the reference clock 110, the embodiment illustrated in FIG. 1B electrically couples the first DC pulse generator 108 with the second DC pulse generator 114 and AC power source 112 in order to output from the second DC pulse generator 114 based on the output of the first DC pulse generator 108. In other words, the first DC pulse generator 108 and second DC pulse generator 114 may produce phase-locked rectangular waveforms by having the second DC pulse generator 114 output based on the first pulsed DC bias output by the first DC pulse generator 108 with adjusted time delay. Additional details will be described below using FIG. 4.

In other embodiments, the plasma processing systems 100 of FIGS. 1A-1B may electrically couple the AC power source 112 to the top electrode 102 as opposed to the bottom electrode 104.

FIGS. 2A-2D illustrate schematic timing diagrams of the phase-locked rectangular waveforms and an AC waveform in accordance with various embodiments of this disclosure. The AC waveforms (labeled source power (SP) potential) may be used by the plasma processing systems 100 illustrated in FIGS. 1A-1B to generate the plasma 116. All of the rectangular waveforms illustrated in the schematic timing diagrams have the same frequency and opposite polarity between the two phase-locked rectangular waveforms (labeled DCS potential and BP potential). The rectangular waveforms labeled DCS potential of FIGS. 2A-2D may be used as the first pulsed DC bias applied to the top electrode 102 in FIGS. 1A-1B. The rectangular waveforms labeled BP potential of FIGS. 2A-2D may be used as the second pulsed DC bias applied to the bottom electrode 104 in FIGS. 1A-1B.

Each schematic timing diagram of FIGS. 2A-2D illustrate different pulse alignments and duty cycles between the phase-locked rectangular waveforms. In every timing diagram, the on-phases of the BP potential pulses are contained within the off-phases of the DCS potential pulses. Illustrated in each of the timing diagrams of FIGS. 2A-2D are the characterizing parameters of each of the illustrated waveforms, which are a DCS pulse width ($t_{DCS}$), a DCS amplitude ($A_{DCS}$), a DCS on-phase time ($t_{DCS,ON}$), a DCS off-phase time ($t_{DCS,OFF}$), a BP pulse width ($t_{BP}$), a BP amplitude ($A_{BP}$), a BP on-phase time ($t_{BP,ON}$), a BP off-phase time ($t_{BP,OFF}$), a SP pulse width ($t_{SP}$), and a SP amplitude ($A_{SP}$). By definition, the duty cycle of a DC pulse is the percentage of time the pulse is in an on-phase. Thus, a DCS duty cycle ($D_{DCS}$) may be defined as $$D_{DCS} = 100\% \times \frac{t_{DCS,ON}}{t_{DCS}},$$

and a BP duty cycle ($D_{BP}$) may be defined as $$D_{BP} = 100\% \times \frac{t_{BP,ON}}{t_{BP}}.$$

Each of the illustrated schematic timing diagrams of FIGS. 2A-2D may be used in the plasma processing method of this disclosure.

Each of the FIGS. 2A-2D illustrate the DCS potential waveform, which may be the first pulsed DC bias applied to the top electrode 102. The BP potential waveform may be the second pulsed DC bias applied to the bottom electrode 104, and the SP potential waveform may be the AC waveforms applied to the bottom electrode 104. All of the illustrated embodiments of FIGS. 2A-2D have the DCS amplitude of the DCS potential waveform ($A_{DCS}$) at a value of −1 kV, the BP amplitude of the BP potential waveform ($A_{BP}$) at −7 kV, and the SP amplitude of the SP potential waveform ($A_{SP}$) at a peak-to-peak voltage of 0.2 $kV_{pp}$. Various other embodiments may use different amplitudes for the DCS potential, BP potential, and SP potential waveforms, such as $A_{DCS}$=−0.1 kV to −2 kV, $A_{BP}$=−2 kV to −20 kV, $A_{SP}$=0.05 kV to 3 kV.

Figure 2A:
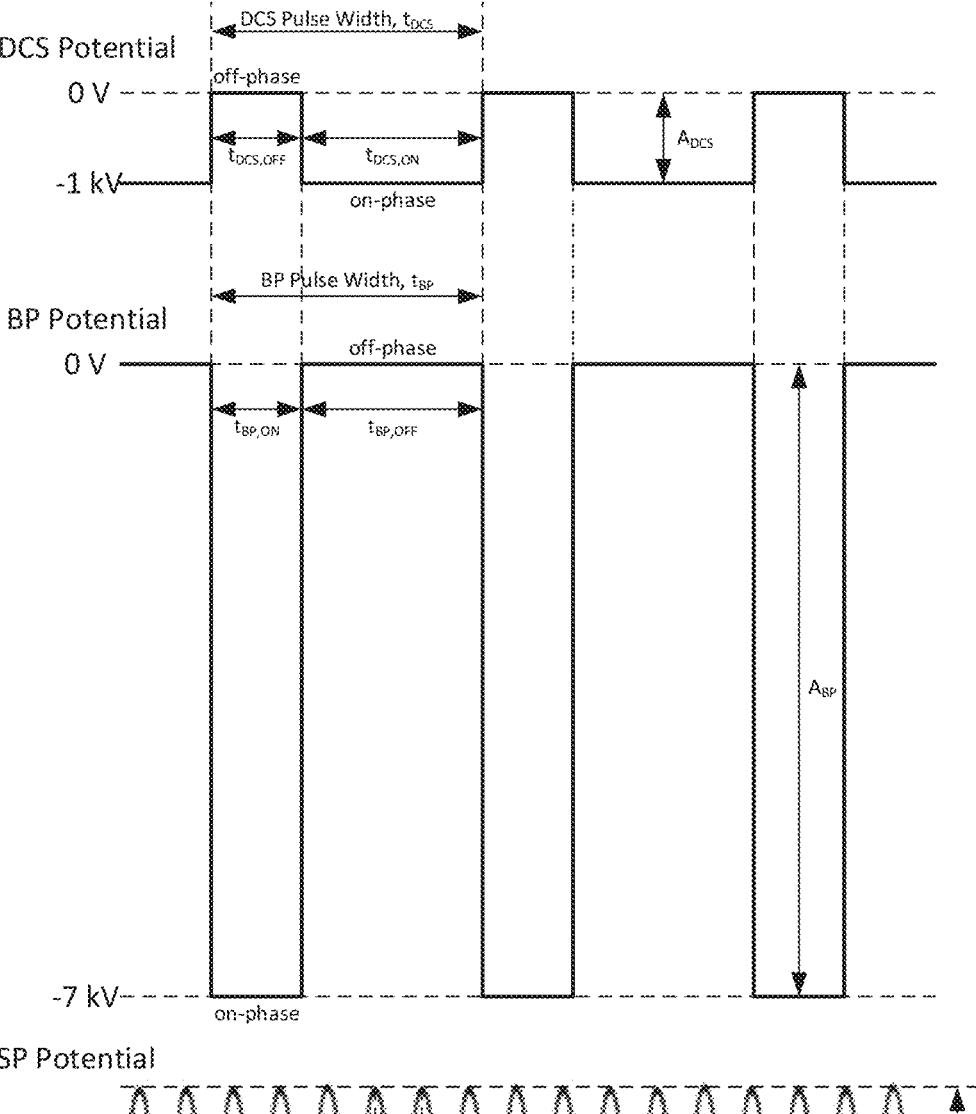
FIG. 2A illustrates a schematic timing diagram of a first pulse train used to bias the top electrode, a second pulse train used to bias the bottom electrode, and a superimposed AC waveforms wave constantly applied to the bottom electrode in an embodiment.

In an embodiment, the phase-locked rectangular waveforms may have the same frequency (and thus, pulse widths) but different duty cycles causing the on- and off-phases to completely align, such as the timing diagram illustrated in FIG. 2A. In FIG. 2A, the portion of the BP potential waveform with a bias of −7 kV (labeled on-phase) aligns with the portion of the DCS potential waveform with a bias of 0 kV (labeled off-phase). The pulse alignment of the phase-locked rectangular waveforms illustrated in FIG. 2A may be accomplished through the use of a reference signal, such as the plasma processing system 100 illustrated in FIG. 1A, which uses the reference clock 110. The DCS duty cycle and the BP duty cycle of the rectangular waveforms illustrated in FIG. 2A are different, and $D_{DCS}$ is 66.7% and $D_{BP}$ is 33.3%.

Figure 2B:
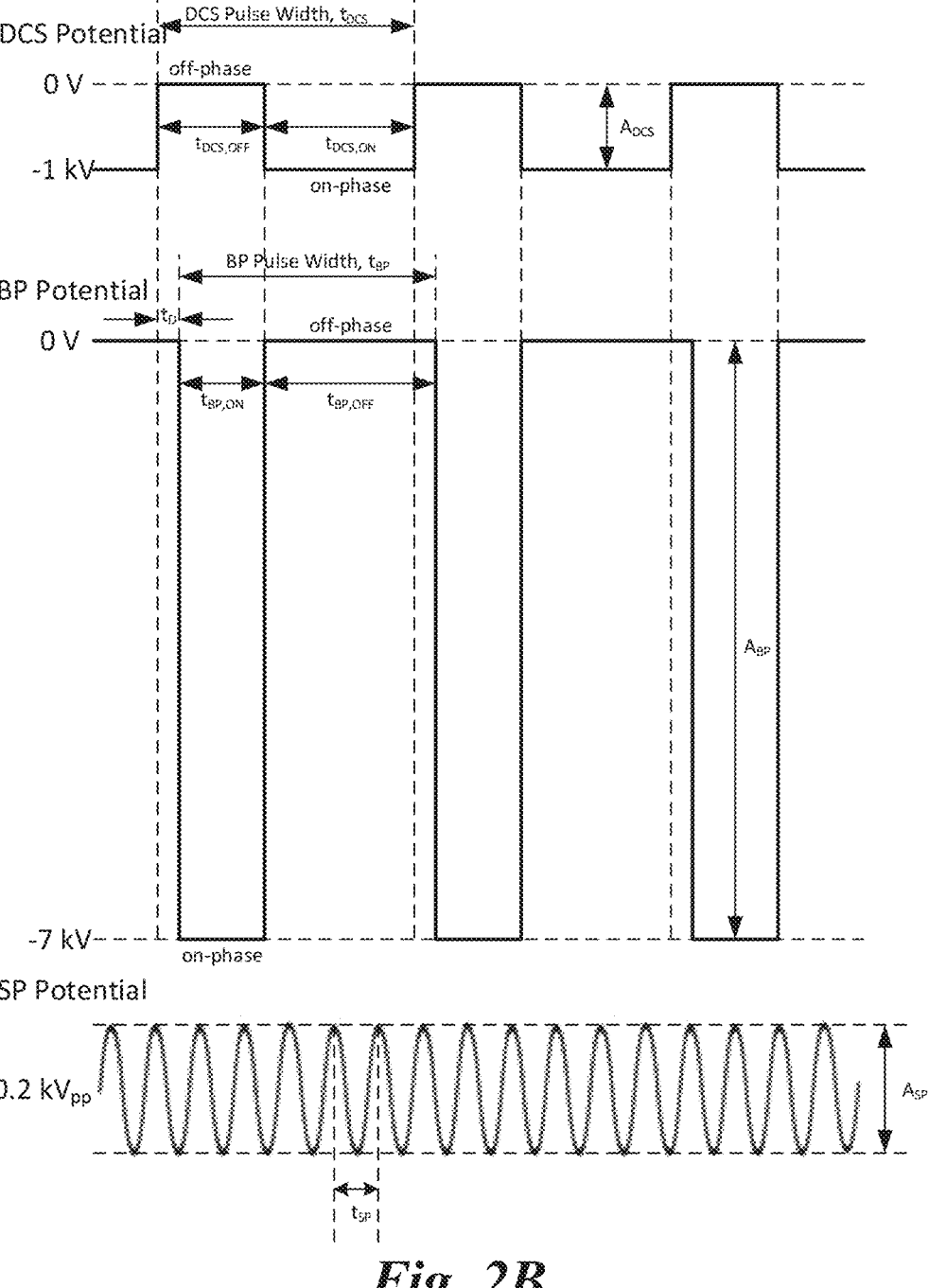
FIG. 2B illustrates a schematic timing diagram of a first pulse train used to bias the top electrode, a second pulse train used to bias the bottom electrode with an offset compared to the first pulse train, and a superimposed AC waveform constantly applied to the bottom electrode in an embodiment.

In another embodiment, the phase-locked rectangular waveforms may have the same frequency (and thus, pulse widths) but different duty cycles causing the on- and off-phases to align in the manner illustrated in the timing diagram of FIG. 2B. In FIG. 2B, the trailing portion of the BP potential waveform with a bias of −7 kV (labeled on-phase) aligns with the trailing portion of the DCS potential waveform with a bias of 0 kV (labeled off-phase), but their starting portions do not align. The starting portion of the BP potential waveform with a bias of −7 kV begins a short time after the starting portion of the DCS potential waveform with a bias of 0 kV, which is labeled the delay time ($t_D$). Though the on-phase of the BP potential waveform does not completely align with the off-phase of the DCS potential waveform, the pulse width of the on-phase of the BP potential waveform ($t_{BP,ON}$) is completely contained within the pulse width of the off-phase of the DCS potential waveform ($t_{DCS,OFF}$).

The pulse alignment of the phase-locked rectangular waveforms illustrated in FIG. 2B may be accomplished through a trigger system which may trigger based on the DCS potential of the top electrode turning off, such as the plasma processing system 100 illustrated in FIG. 1B, which electrically couples the first DC pulse generator 108 and the second DC pulse generator 114. The DCS duty cycle and the BP duty cycle of the rectangular waveforms illustrated in FIG. 2B are different, and $D_{DCS}$ is 58.3% and $D_{BP}$ is 33.3%.

Figure 2C:
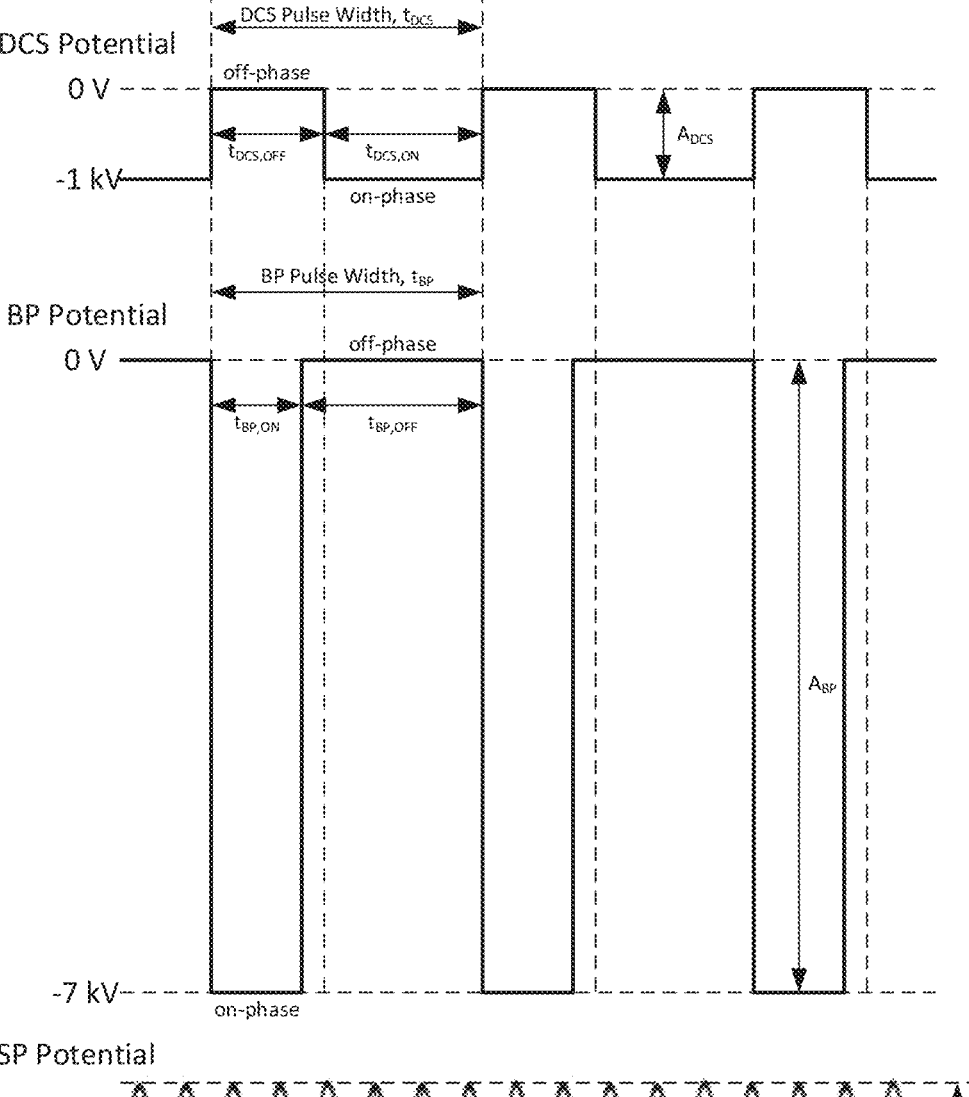
FIG. 2C illustrates a schematic timing diagram of a first pulse train used to bias the top electrode, a second pulse train used to bias the bottom electrode with a shorter pulsing duration compared to the first pulse train, and a superimposed AC waveform constantly applied to the bottom electrode in an embodiment.

In another embodiment, the phase-locked rectangular waveforms may have the same frequency (and thus, pulse widths) but different duty cycles causing the on- and off-phases to align in the manner illustrated in the timing diagram of FIG. 2C. In FIG. 2C, the starting portion of the BP potential waveform with a bias of −7 kV (labeled on-phase) aligns with the starting portion of the DCS potential waveform with a bias of 0 kV (labeled off-phase), but their trailing portions do not align. The trailing portion of the BP potential waveform with a bias of −7 kV ends a short time before the trailing portion of the DCS potential waveform with a bias of 0 kV. Though the on-phase of the BP potential waveform does not completely align with the off-phase of the DCS potential waveform, the pulse width of the on-phase of the BP potential waveform ($t_{BP,ON}$) is completely contained within the pulse width of the off-phase of the DCS potential waveform ($t_{DCS,OFF}$).

The pulse alignment of the phase-locked rectangular waveforms illustrated in FIG. 2C may be accomplished through the use of a reference signal, such as the plasma processing system 100 illustrated in FIG. 1A, which uses the reference clock 110. The DCS duty cycle and the BP duty cycle of the rectangular waveforms illustrated in FIG. 2C are different, and $D_{DCS}$ is 66.7% and $D_{BP}$ is 33.3%.

Figure 2D:
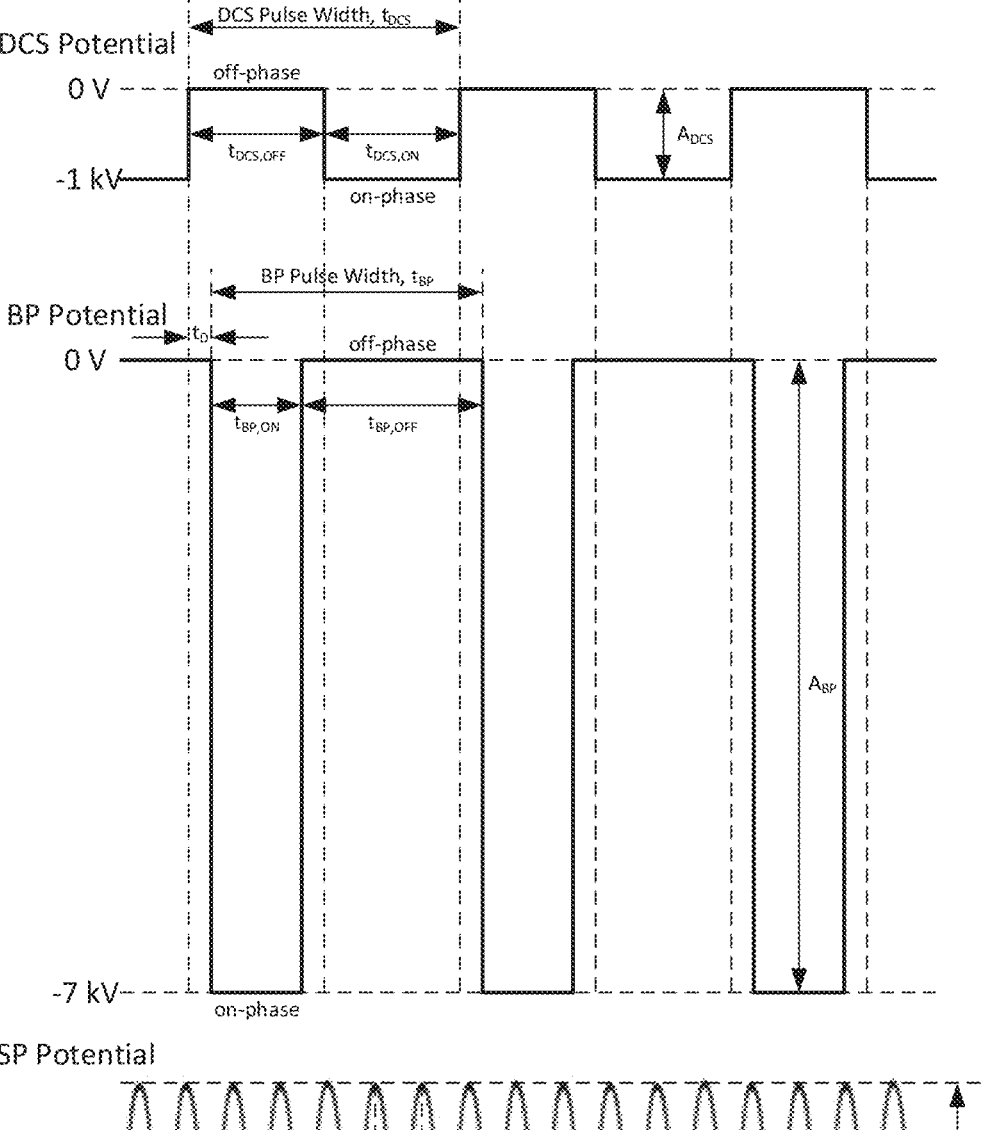
FIG. 2D illustrates a schematic timing diagram of a first pulse train used to bias the top electrode, a second pulse train used to bias the bottom electrode with both an offset and a shorter pulsing duration compared to the first pulse train, and a superimposed AC waveform constantly applied to the bottom electrode in an embodiment.

In yet another embodiment, the phase-locked rectangular waveforms may have the same frequency (and thus, pulse widths) but different duty cycles causing the on- and off-phases to align in the manner illustrated in the timing diagram of FIG. 2D. In FIG. 2D, the trailing portion of the BP potential waveform with a bias of −7 kV (labeled on-phase) aligns with the trailing portion of the DCS potential waveform with a bias of 0 kV (labeled off-phase), but their starting portions do not align. The starting portion of the BP potential waveform with a bias of −7 kV begins a short time after the starting portion of the DCS potential waveform with a bias of 0 kV, which is labeled the delay time ($t_D$). Though the on-phase of the BP potential waveform does not completely align with the off-phase of the DCS potential waveform, the pulse width of the on-phase of the BP potential waveform ($t_{BP,ON}$) is completely contained within the pulse width of the off-phase of the DCS potential waveform ($t_{DCS,OFF}$).

The pulse alignment of the phase-locked rectangular waveforms illustrated in FIG. 2D may be accomplished through a trigger system which may trigger based on the DCS potential of the top electrode turning off, such as the plasma processing system 100 illustrated in FIG. 1B, which electrically couples the first DC pulse generator 108 and the second DC pulse generator 114. The DCS duty cycle and the BP duty cycle of the rectangular waveforms illustrated in FIG. 2D are different, and $D_{DCS}$ is 50% and $D_{BP}$ is 33.3%.

In various embodiment, the parameters defining the characteristics of the DCS potential, BP potential, and SP potential vary. For example, the frequency of the DCS potential and the frequency of the BP potential are the same and are smaller than the frequency of the SP potential. The frequency of the SP potential may vary between about 1 MHz to 100 MHz. The duty cycles of the BP potential may vary between about 5% and 70% in various embodiments, and accordingly the duty cycles of the DCS potential may change between about 30% and 95%. The amplitude of the DCS potential may vary between about −0.1 kV and −2 kV. The amplitude of the BP potential may vary between about −2 kV and −20 kV. And the amplitude of the SP potential may vary between about 0.05 kV and 3 kV.

Figure 3A:
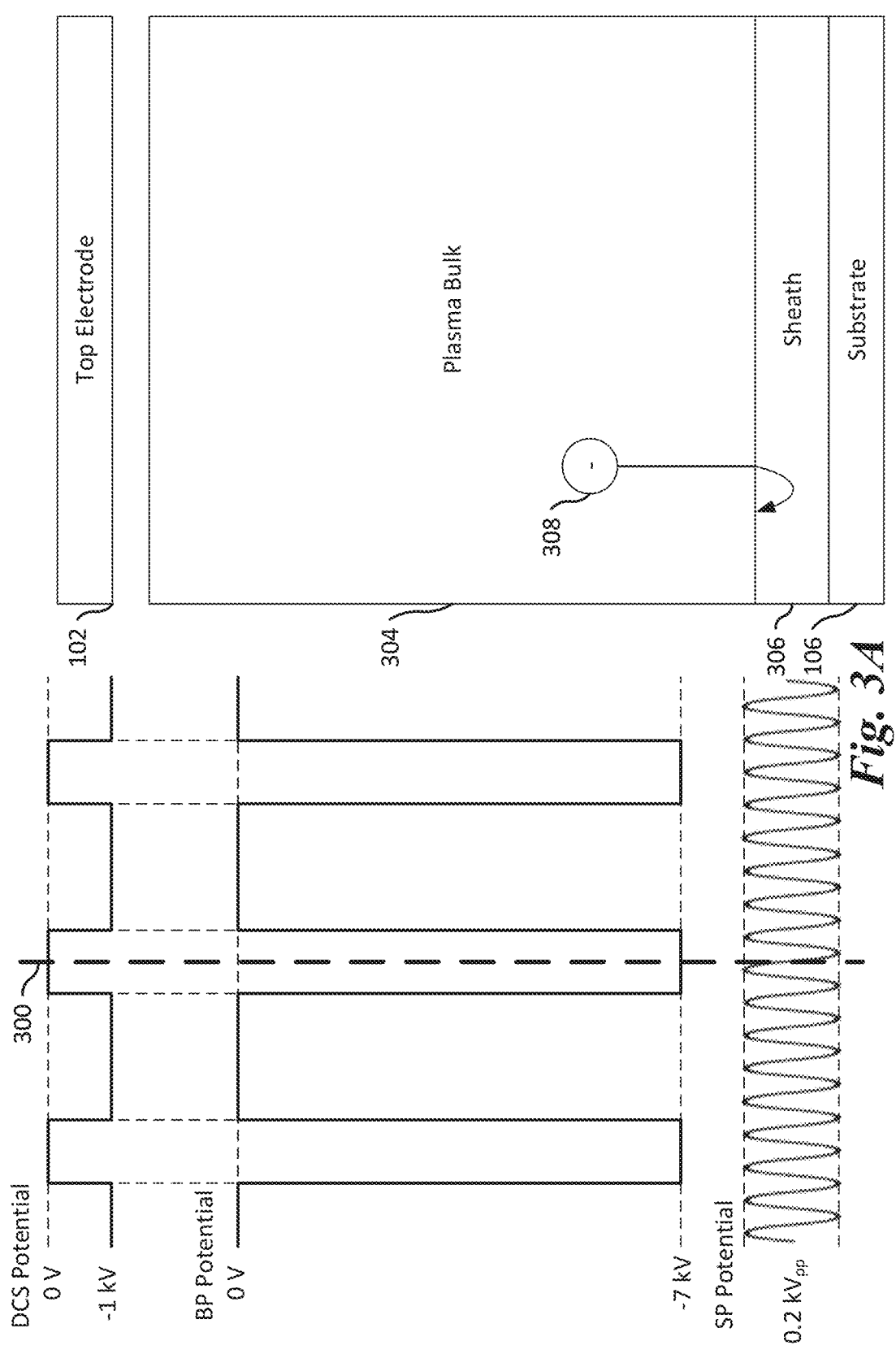
FIG. 3A illustrates the behavior of the plasma in a plasma processing system at a time when the top electrode is in an off-state and the bottom electrode is in an on-state in accordance with an embodiment of the invention.
Figure 3B:
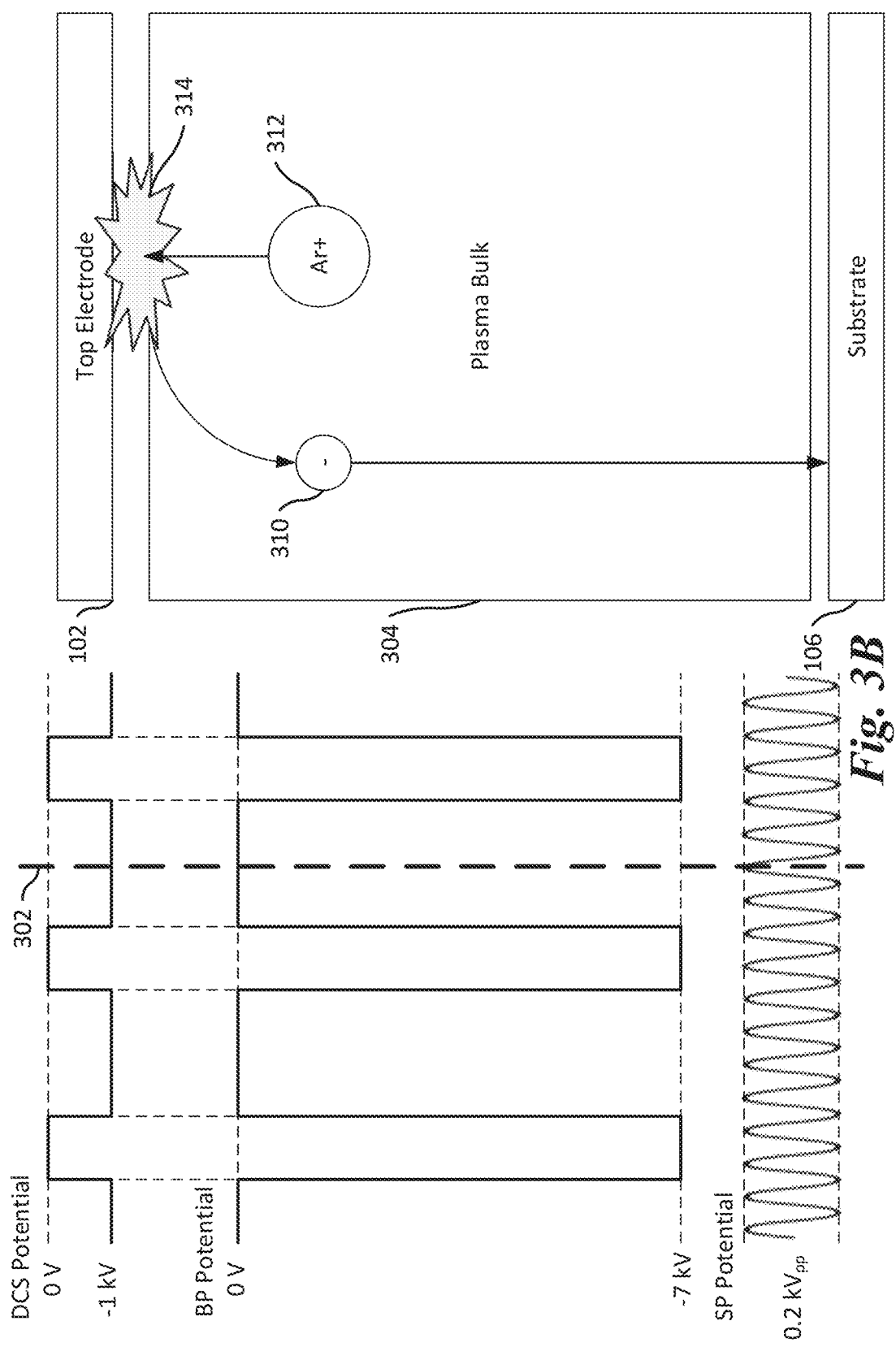
FIG. 3B illustrates the behavior of the plasma in a plasma processing system at a time when the top electrode is in an on-state and the bottom electrode is in an off-state in accordance with an embodiment of the invention.

FIGS. 3A-3B illustrate the behavior of elements of the plasma in a plasma processing system during a single period of the phase-locked rectangular waveforms in accordance with an embodiment. The examples illustrated in FIGS. 3A-3B use the waveforms illustrated in the timing diagrams of FIG. 2A, though the same behavior would be observed for embodiments using any of the sets of waveforms illustrated in FIGS. 2A-2D. Illustrated in FIGS. 3A-3B is the timing diagram of FIG. 2A and a diagram illustrating the behavior of elements of the plasma during an indicated phase of the set of waveforms.

A first phase 300 is illustrated in FIG. 3A as the first portion of a single period of the phase-locked rectangular waveforms. The first phase 300 corresponds to the on-phase of the BP potential and the off-phase of the DCS potential. Illustrated proximally to the timing diagram is a schematic diagram of components of the plasma processing system and the plasma between the top electrode 102 and the substrate 106. The diagram comprises the top electrode 102, a plasma bulk 304 of the plasma 116, an electron 308 of the plasma 116, and a sheath 306 formed above the substrate 106.

The plasma bulk 304 comprises a large quantity of neutral atoms, a smaller quantity of electrons 308 and positive ions. The quantity of positive ions is approximately equal to the quantity of negative charges including electrons and negative ions, thus the plasma bulk 304 is commonly described as quasi-neutral. The sheath 306, on the other hand, is not quasi-neutral.

The sheath 306 is formed in regions where the plasma 116 meets a solid, such as the substrate 106. The structure and thickness of the sheath 306 depends on the potential difference between the solid surface and the plasma potential. In this embodiment, the substrate 106 is not floating, but is biased with the combination of the SP potential and the BP potential waveforms. As a result, a space-charge layer is established which provides an electric field with the purpose of adjusting the net electric current of the plasma chamber 120 to match the initial conditions imposed by the power supplies of the plasma processing system 100. This space-charge layer is called the sheath 306. The first phase 300 has the substrate 106 at a negative potential of −7 kV, which causes the sheath 306 to form because of the potential difference between the substrate 106 and the plasma potential.

During the first phase 300 illustrated in FIG. 3A, the substrate 106 is driven by the bottom electrode 104, so the same BP potential is applied to the substrate 106. As a result, the substrate 106 is biased roughly around −7 kV during the first phase 300 with the SP potential superimposed with the BP potential as well. The top electrode 102 is biased at 0 kV during the first phase 300. Positive ions within the plasma bulk 304 are accelerated by the −7 kV bias applied to the substrate 106, which causes the positive ions to be subsequently delivered to the substrate 106 during the first phase. In an embodiment, the positive ions may be used to etch the substrate 106 to form HARC features.

The large negative potential applied to the substrate 106 during the first phase 300 repels the electrons 308 from the plasma bulk 304. In an embodiment, one of the electrons 308 from the plasma bulk 304 may follow the illustrated path of FIG. 3A, where the electron 308 moves towards the substrate 106, enters the sheath 306, and is repelled by the negative bias on the substrate 106 back into the plasma bulk 304. A benefit of using the phase-locked rectangular waveforms of this disclosure is the significant reduction in the energy of ion bombardments on the top electrode 102 during the first phase 300. As a result, sputtering of the top electrode 102 by positive ions is reduced, which also reduces deposition of sputtered material from the top electrode 102 (such as silicon) on the substrate 106. Another result of the zero DCS potential on the top electrode 102 during the first phase 300 is the ion flux available for processing the substrate 106 may be increased due to the larger plasma bulk volume, which is another benefit of this disclosure.

A second phase 302 is illustrated in FIG. 3B as the second portion of a single period of the phase-locked rectangular waveforms. The second phase 302 corresponds to the off-phase of the BP potential and the on-phase of the DCS potential. Illustrated proximally to the timing diagram are components of the plasma processing system and the plasma between the top electrode 102 and the substrate 106. The illustrated diagram of FIG. 3B comprises the top electrode 102, the plasma bulk 304, and the substrate 106.

During the second phase 302, the top electrode 102 is biased at −1 kV from the DCS potential and the bottom electrode 104, which the substrate 106 is electrically coupled with, is biased at 0 kV from the BP potential with the SP potential superimposed. The sheath 306 of FIG. 3A has diminished in FIG. 3B as a result of the 0 kV bias on the substrate 106. A positive ion 312 is accelerated through the large negative potential imposed on the top electrode 102 during the second phase 302. In this embodiment, the positive ion 312 is illustrated as an argon ion, but in various other embodiments the plasma may comprise different elements or chemical compounds, such as nitrogen, for example. As an example, the positive ion 312 is accelerated towards the top electrode 102 where it has a collision 314 with the top electrode 102. The collision 314 produces a secondary electron 310.

The secondary electron 310 may then be repelled by the negative potential bias on the top electrode 102 as illustrated in FIG. 3B. The secondary electron 310 is accelerated down to the substrate 106 where it may neutralize positive charge build up in HARC features being etched. The mitigation of positive charge aggregation in HARC features during etching is another benefit of this disclosure.

Figure 4:
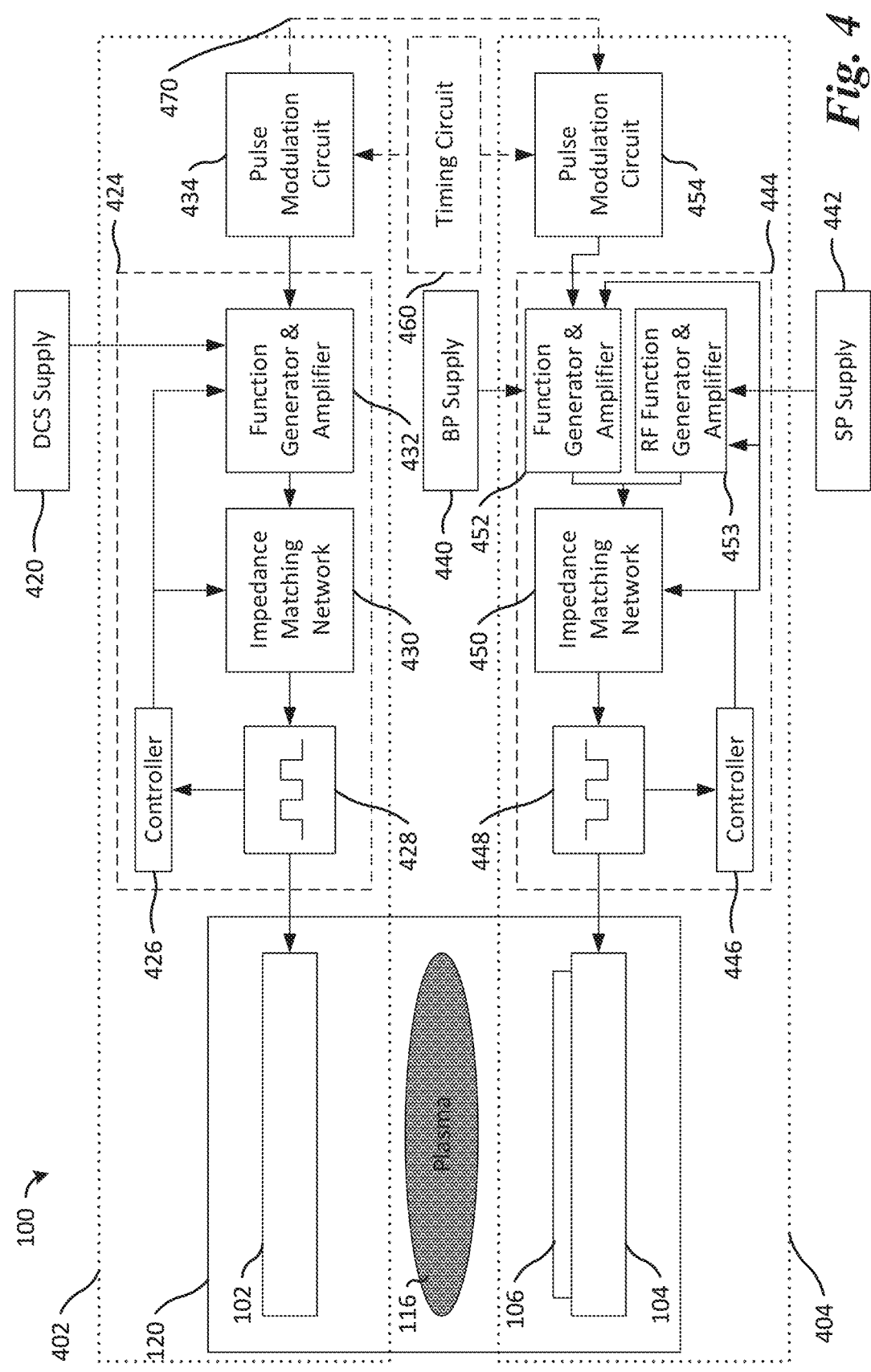
FIG. 4 illustrates a block diagram of an example plasma processing system in accordance with an embodiment of the invention.

FIG. 4 illustrates a block diagram of the plasma processing system 100 in accordance with an embodiment of this disclosure. The plasma processing system 100 of FIG. 4 may be used to perform the embodiment methods as described herein, such as the methods of FIG. 5 or FIG. 6, for example.

Referring to FIG. 4, the plasma processing system 100 comprises the plasma chamber 120, a DCS supply 420, a top generator circuit 424, a top pulse modulation circuit 434, a bias power (BP) supply 440, a source power (SP) supply 442, a bottom generator circuit 444, a bottom pulse modulation circuit 454, and a timing circuit 460. Disposed in the plasma chamber 120 is the top electrode 102 opposite the bottom electrode 104, and the substrate 106 on the bottom electrode 104. The DCS supply 420 is coupled to the top electrode 102 through a top control path 402. The BP supply 440 and the SP supply 442 are coupled to the bottom electrode 104 through a bottom control path 404.

In the embodiment illustrated in the block diagram of FIG. 4, the top control path 402 comprises the top electrode 102, the top generator circuit 424, and the top pulse modulation circuit 434. The top generator circuit 424 comprises a top controller 426, a top function generator and amplifier 432, a top impedance matching network 430, and a top directional coupler 428. The bottom control path 404 comprises the bottom electrode 104, the bottom generator circuit 444, and the bottom pulse modulation circuit 454. And the bottom generator circuit 444 comprises a bottom controller 446, a bottom function generator and amplifier 452, a RF function generator and amplifier 453, a bottom impedance matching network 450, and a bottom directional coupler 448.

Still referring to FIG. 4, the timing circuit 460 is coupled to both the top control path 402 and the bottom control path 404 and may be configured to provide a reference signal to both. The reference signal may be generated according to plasma processing parameters configured in the timing circuit 460, such as a frequency, and a pulse width. The timing circuit 460 electrically couples to the top control path 402 through the top pulse modulation circuit 434, and the top pulse modulation circuit 434 receives the reference signal. The timing circuit 460 electrically couples to the bottom control path 404 through the bottom pulse modulation circuit 454 and the bottom pulse modulation circuit 454 receives the same reference signal.

The top pulse modulation circuit 434 generates a DCS signal based on the reference signal from the timing circuit 460 and modulates the DCS signal between high amplitude and low amplitude states based on configured settings without changing the frequency of the reference signal. In an embodiment, the DCS signal is a rectangular wave. The top pulse modulation circuit 434 outputs the DCS signal with the same frequency and pulse width as the reference signal, with a set amplitude specific to the top pulse modulation circuit 434, and with a duty cycle imposed on the waveform by the top pulse modulation circuit 434. The DCS signal is sent to the top generator circuit 424 via an electrical coupling to the top function generator and amplifier 432.

The top function generator and amplifier 432 is electrically coupled with the DCS supply 420, the top controller 426, the top pulse modulation circuit 434, and the top impedance matching network 430. The top function generator and amplifier 432 receive inputs from the DCS supply 420, the top controller 426, and the top pulse modulation circuit 434 to generate a top electrical potential which may be used to power the top electrode 102 to operate the plasma processing system 100. The function generator of the top function generator and amplifier 432 generates an electrical potential with the same frequency, pulse width, and duty cycle as the DCS signal, and with some amplitude. The function generator may superimpose a waveform on the DCS signal to generate the electrical potential. The superimposed waveform may have any desired shape, such as a sinusoidal wave, a rectangular (or square) wave, a sawtooth wave, and the like. Alternatively, the waveform shape may include an aperiodic wave such as a superposition of multiple sinusoidal waves of various frequencies to generate an arbitrary waveform shape. In certain embodiments where the desired powering scheme for the top electrode 102 is a rectangular wave, the function generator may be omitted because the output from the top pulse modulation circuit 434 is already a rectangular wave.

In the illustrated embodiment of FIG. 4, the DCS supply 420 outputs to the top function generator and amplifier 432 a DCS power configuring the amplifier to amplify the electrical potential generated from the function generator to an amplitude specific to the plasma processing method the plasma processing system 100 is executing. A DCS potential is produced from amplifying through the amplifier the electrical potential generated by the function generator of the top function generator and amplifier 432. The DCS potential is then sent to the top impedance matching network 430. In an embodiment, a filter may be included between the top impedance matching network 430 and the top function generator and amplifier 432 to filter out noise present in the DCS potential.

The DCS potential is received at the top impedance matching network 430. The top impedance matching network 430 is electrically coupled to the top function generator and amplifier 432, to the top controller 426, and to the top directional coupler 428. The top impedance matching network 430 may be used to ensure the DCS potential is efficiently coupled to the top electrode 102 of the plasma chamber 120 by matching the impedance of the load to the impedance of the DCS supply 420. After passing through the top impedance matching network 430, the DCS potential passes through the top directional coupler 428.

The top directional coupler 428 is configured to pass the DCS potential to the top electrode 102, which is a non-resonant coupling electrode in the illustrated embodiment of FIG. 4. The top directional coupler 428 is also coupled to the top controller 426 which may beneficially allow the top controller 426 to adjust power settings based on a comparison of the forward DCS power and the reverse DCS power. For example, the forward DCS power may be an indication of the magnitude of the power being transmitted in a forward direction (i.e., toward the top electrode 102) while the reverse DCS power may be an indication of the magnitude of the power being reflected in a reverse direction (i.e., away from the top electrode 102). The forward DCS power and the reverse DCS power may be measured by the top controller 426.

The top controller 426 may be electrically coupled to the top directional coupler 428, the top impedance matching network 430, and the top function generator and amplifier 432. In various embodiments, the top controller 426 may be configured to control various power settings for producing the DCS potential applied to the top electrode 102. For example, the top controller 426 may adjust impedance matching settings for the top impedance matching network 430, and may adjust gain settings for the top function generator and amplifier 432.

In a similar configuration as the equipment to power the top electrode 102 described above, the reference signal from the timing circuit 460 may also be output to the bottom control path 404 via an electrical coupling between the timing circuit 460 and the bottom pulse modulation circuit 454. As detailed above, the reference signal provided to the bottom pulse modulation circuit 454 may be characterized by the same frequency and pulse width as the reference signal provided to the top pulse modulation circuit 434.

The bottom pulse modulation circuit 454 generates a bias pulse (BP) signal based on the reference signal from the timing circuit 460 and modulates the BP signal between high amplitude and low amplitude states based on configured settings without changing the frequency of the reference signal. In various embodiments, the BP signal and the DCS signal are rectangular waveforms. The bottom pulse modulation circuit 454 outputs the BP signal with the same frequency and pulse width as the reference signal, with a set amplitude specific to the bottom pulse modulation circuit 454, and with a duty cycle imposed on the waveform by the bottom pulse modulation circuit 454. The BP signal is sent to the bottom generator circuit 444 via an electrical coupling to the bottom function generator and amplifier 452.

The bottom function generator and amplifier 452 is electrically coupled with the BP supply 440, the bottom controller 446, the bottom pulse modulation circuit 454, and the bottom impedance matching network 450. The bottom function generator and amplifier 452 receive inputs from the BP supply 440, the bottom controller 446, and the bottom pulse modulation circuit 454 to generate a bottom electrical potential which may be used to power the bottom electrode 104 to operate the plasma processing system 100. The function generator of the bottom function generator and amplifier 452 generates an electrical potential with the same frequency, pulse width, and duty cycle as the BP signal, and with some amplitude. The function generator may superimpose a waveform on the BP signal to generate the electrical potential. The superimposed waveform may have any desired shape, such as a sinusoidal wave, a rectangular (or square) wave, a sawtooth wave, and the like. Alternatively, the waveform shape may include an aperiodic wave such as a superposition of multiple sinusoidal waves of various frequencies to generate an arbitrary waveform shape. In certain embodiments where the desired powering scheme for the bottom electrode 104 is a rectangular wave, the function generator may be omitted because the output from the bottom pulse modulation circuit 454 is already a rectangular wave.

In the illustrated embodiment of FIG. 4, the BP supply 440 outputs to the bottom function generator and amplifier 452 a BP power configuring the amplifier to amplify the electrical potential generated from the function generator to an amplitude specific to the plasma processing method the plasma processing system 100 is executing. A BP potential is produced from amplifying through the amplifier the electrical potential generated by the function generator of the bottom function generator and amplifier 452. The BP potential is then added (or superimposed) with a source power (SP) potential generated from the RF function generator and amplifier 453 to form a superimposed source-bias power (SBP) potential.

Still referring to FIG. 4, the RF function generator and amplifier 453 is electrically coupled to the bottom controller 446, the SP supply 442, and the bottom impedance matching network 450. The RF function generator generates an electrical potential according to instructions from the bottom controller 446. For example, the instructions may include a second frequency and a second pulse width at a second amplitude. The electrical potential produced by the RF function generator then passes through the amplifier of the RF function generator and amplifier 453. The SP supply 442 outputs to the RF function generator and amplifier 453 a SP power configuring the amplifier to amplify the electrical potential generated from the RF function generator to an amplitude specific to the plasma processing method the plasma processing system 100 is executing. The SP potential produced by amplifying the electrical potential generated by the RF function generator may be any waveform specified by the plasma processing method, such as a sinusoidal wave, a square wave, a sawtooth wave, etcetera, and may be used to generate the plasma 116 in the plasma chamber 120. The SP potential may then be superimposed with the BP potential output from the bottom function generator and amplifier 452 to form the SBP potential, which may then be passed to the bottom impedance matching network 450. In an embodiment, a filter may be included between the bottom impedance matching network 450 and the bottom function generator and amplifier 452 and the RF function generator and amplifier 453 to filter out noise present in the SBP potential.

The SBP potential is received at the bottom impedance matching network 450. The bottom impedance matching network 450 is electrically coupled to the bottom function generator and amplifier 452, to the RF function generator and amplifier 453, to the bottom controller 446, and to the bottom directional coupler 448. The bottom impedance matching network 450 may be used to ensure the SBP potential is efficiently coupled to the bottom electrode 104 of the plasma chamber 120 by matching the impedance of the load to the impedance of the BP supply 440 and SP supply 442. The bottom impedance matching network 450 may also be used to efficiently provide source power to the plasma 116. For maximum power to be transferred from the bottom electrode 104 to the plasma 116, the impedance of the load on the power supply is kept the same as the impedance of the power supply itself through the use of the bottom impedance matching network 450. For example, the impedance of the load on the power supply may be influenced by the impedance of the plasma 116, which may depend on specific rapidly changing conditions such as chemistry, pressure, density, and others. Therefore, the bottom impedance matching network 450 may beneficially allow plasma conditions to vary while maintaining efficient power coupling of the SP potential (which is superimposed on the BP potential) to the plasma 116. After passing through the bottom impedance matching network 450, the SBP potential passes through the bottom directional coupler 448.

The bottom directional coupler 448 is configured to pass the SBP potential to the bottom electrode 104, which is a non-resonant coupling electrode in the illustrated embodiment of FIG. 4. The bottom directional coupler 448 is also coupled to the bottom controller 446 which may beneficially allow the bottom controller 446 to adjust power settings based on a comparison of the forward SBP power and the reverse SBP power. For example, the forward SBP power may be an indication of the magnitude of the power being transmitted in a forward direction (i.e., toward the bottom electrode 104) while the reverse SBP power may be an indication of the magnitude of the power being reflected in a reverse direction (i.e., away from the bottom electrode 104). The forward SBP power and the reverse SBP power may be measured by the bottom controller 446.

The bottom controller 446 may be electrically coupled to the bottom directional coupler 448, the bottom impedance matching network 450, the bottom function generator and amplifier 452, and the RF function generator and amplifier 453. In various embodiments, the bottom controller 446 may be configured to control various power settings for producing the SBP potential applied to the bottom electrode 104. For example, the bottom controller 446 may adjust impedance matching settings for the bottom impedance matching network 450, may adjust gain settings for the bottom function generator and amplifier 452, and may configure and adjust gain settings and the parametrization for producing the SP potential from the RF function generator and amplifier 453.

In various embodiments, the SBP potential applied to the bottom electrode 104 may be the waveform produced by superimposing the BP potential rectangular waveform with the SP potential waveform of FIGS. 2A-2D. In similar embodiments, the DCS potential applied to the top electrode 102 may be the waveform illustrated as the DCS potential rectangular waveform of FIGS. 2A-2D. The embodiment illustrated in FIG. 4 may power the electrodes of the plasma chamber 120 by producing phase-locked rectangular waveforms through configuration settings in the top controller 426 and the bottom controller 446, and using the same reference signal from the timing circuit 460.

The timing circuit 460 may be any form of electrical circuit configured to output a reference signal of a set frequency and pulse width. For example, the timing circuit 460 may be a reference clock in an embodiment (such as the reference clock 110 of FIG. 1A).

The pulse modulation circuits, such as the top pulse modulation circuit 434 and the bottom pulse modulation circuit 454, may be any typical pulse modulation circuit capable of modulating the signals it receives. For example, the pulse modulation circuits can be implemented, e.g., using a laser driver capable of generating high power pulses for laser diodes.

A function generator, such as the function generator of the top function generator and amplifier 432, the function generator of the bottom function generator and amplifier 452, and the RF function generator of the RF function generator and amplifier 453, may be a circuit including an electronic oscillator. More than one electronic oscillator may be included in a function generator. Waveforms may be generated by a function generator using digital signal processing. The digital output may then be converted with a digital-to-analog converter to produce an analog waveform. A function generator may also include modulation functions such as amplitude modulation, frequency modulation, or phase modulation. In various embodiments, the top function generator and the bottom function generator may be a signal generator, and may be a radio frequency (RF) signal generator in one embodiment. Alternatively, the function generators may be a microwave function generator. In one embodiment, the function generators may be an arbitrary waveform generator (AWG).

An impedance matching network, such as the top impedance matching network 430 and the bottom impedance matching network 450, may be implemented using feedback control circuits to phase shift compensation signals based on an impedance measurement. For example, an impedance matching network may include a network of inductors, capacitors, and/or variable capacitors. In other embodiments, impedance matching may be the adjustment of the driving frequency to match the antenna-plasma resonance, called frequency tuning. Frequency tuning in pulsed mode may utilize feedback control to take advantage of power or voltage measurements correlating with plasma impedance.

The top controller 426 and the bottom controller 446 may be implemented using one or more programmable integrated circuits programmed to provide the functionality described herein. For example, one or more processors (e.g., microprocessor, microcontroller, central processing unit, etc.), programmable logic devices (e.g., CPLD (complex programmable logic device), FPGA (field programmable gate array), etc.), and/or other programmable integrated circuits may be programmed with software or other programming instructions to implement any of the functionality described herein. The software or other programming instructions may be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions, when executed by the programmable integrated circuits, cause the programmable integrated circuits to perform the processes, functions, and/or capabilities described herein. Other variations of the above could also be implemented.

In another embodiment, the plasma processing system 100 may not include the timing circuit 460. Rather, the plasma processing system 100 may couple the top pulse modulation circuit 434 to the bottom pulse modulation circuit 454 via a path 470. This embodiment may accomplish phase-locked rectangular waveforms by producing output at the bottom pulse modulation circuit 454 by triggering off of the signals from the top pulse modulation circuit 434 to generate phase-locked rectangular waveforms.

In yet another embodiment, the plasma processing system 100 may not include the timing circuit 460 and only have a shared pulse modulation circuit (as opposed to having both the top pulse modulation circuit 434 and the bottom pulse modulation circuit 454). In this embodiment, the shared pulse modulation circuit has a single output split to go to both the top generator circuit 424 and the bottom generator circuit 444. The phase-locked rectangular waveforms may be accomplished in this embodiment by performing separate actions in both the top generator circuit 424 and the bottom generator circuit 444 on the split output received from the shared pulse modulation circuit, such as using an inverting amplifier in one of either the top function generator and amplifier 432 or the bottom function generator and amplifier 452.

The various embodiments described for FIG. 4 may also be implemented in embodiments where the components used to produce the SP potential are coupled in a similar configuration, but on the top electrode 102. In those embodiments, the BP potential is applied to the bottom electrode 104, and the superimposed waveform resulting from adding the DCS potential and SP potential may be applied to the top electrode 102.

An example phase-locked rectangular plasma processing method is illustrated in FIG. 5 in accordance with an embodiment of this disclosure. The plasma processing system 100 of FIGS. 1A-1B, and FIG. 4 may be used to perform the embodiment method as described using FIG. 5. In box 502, an AC waveform may be output to a bottom electrode of a plasma chamber using an AC power source. The AC waveforms may be any signal capable of generating a plasma suitable for the plasma process being used (such as for etching a substrate). In various embodiments, the AC waveforms may be any of the sinusoidal waveforms labeled SP potential in FIGS. 2A-2D.

In box 504, a first pulse train comprising a first plurality of DC pulses may be generated using a first DC pulse generator, and wherein each DC pulse of the first DC pulse train comprises a first on-state and a first off-state. In box 506, a second pulse train comprising a second plurality of DC pulses may be generated using a second DC pulse generator, and wherein each DC pulse of the second DC pulse train comprises a second on-state and a second off-state. Box 506 further comprises generating the second plurality of DC pulses where the frequency of the second plurality of DC pulses is the same as the frequency of the first plurality of DC pulses and the first on-state is contained within the second off-state. Thus, the second pulse train and the first pulse train are phase-locked. In various embodiments, the first plurality of DC pulses and the second plurality of DC pulses may be the rectangular waveforms illustrated in FIGS. 2A-2D.

Still referring to FIG. 5, in box 508, the first pulse train may be output to the bottom electrode by superimposing itself onto the AC waveforms of SP potential. In box 510, the second pulse train may be output to a top electrode disposed in the plasma chamber opposite the bottom electrode. And in box 512, a plasma process may be implemented to process a substrate disposed in the plasma chamber. The plasma process may be implemented such that the plurality of AC waveforms and first pulse train generates the plasma, the second pulse train drives ions to the surface of the substrate, and the first pulse train generates and drives secondary electrons to the surface of the substrate for charge neutralization.

An example phase-locked rectangular plasma processing method is illustrated in FIG. 6 in accordance with an embodiment of this disclosure. The plasma processing system 100 of FIG. 4 may be used to perform the embodiment method as described using FIG. 6. In box 602, a source power (SP) potential may be output to a bottom electrode of a plasma chamber using an RF function generator in order to generate a plasma. The SP potential may be any signal capable of generating a plasma suitable for the plasma process being used (such as for etching a substrate). In various embodiments, the SP potential may be any of the sinusoidal waveforms labeled SP potential in FIGS. 2A-2D.

In box 604, a reference signal may be output to a top pulse modulation circuit and a bottom pulse modulation circuit using a timing circuit. In box 606, a DCS signal may be generated by the top pulse modulation circuit and a BP signal may be generated by the bottom pulse modulation circuit such that the frequency of the two signals is the same and the duty cycles (or pulse modifications of the reference signals) correspond to the on-phase of the BP signal being contained within the off-phase of the DCS signal. In box 608, the DCS signal may be provided to a top function generator, and the BP signal may be provided to a bottom function generator.

Still referring to FIG. 6, in box 610, a DCS potential may be generated using the top function generator to modify the DCS signal, and a BP potential may be generated using the bottom function generator to modify the BP signal. In various embodiments, the DCS potential may be the rectangular waveform labeled DCS potential of FIGS. 2A-2D and the BP potential may be the rectangular waveform labeled BP potential of FIGS. 2A-2D. In box 612, the BP potential may be added to the SP potential to produce an SBP potential. In box 614, the DCS potential may be provided to a top electrode of the plasma chamber and the SBP potential may be provided to the bottom electrode of the plasma chamber. And in box 616, a plasma process may be performed on a substrate disposed in the plasma chamber where the SP portion of the SBP potential generates a plasma, the BP portion of the SBP potential drives ions to the surface of the substrate, and the DCS potential drives secondary electrons to the surface of the substrate for charge neutralization.

Example embodiments of the invention are described below. Other embodiments can also be understood from the entirety of the specification as well as the claims filed herein.

Example 1. A plasma processing method includes applying AC waveforms to a bottom electrode in a plasma chamber to generate a plasma. The method further includes applying a first pulse train including a first plurality of DC pulses to a top electrode in the plasma chamber, where each DC pulse of the first plurality of DC pulses includes a first on-state and a first off-state. And the method further includes applying a second pulse train including a second plurality of DC pulses to the bottom electrode in the plasma chamber, and where each DC pulse of the second plurality of DC pulses includes a second on-state and a second off-state, the first pulse train being offset in phase relative to the second pulse train so that each first off-state overlaps with each second on-state.

Example 2. The plasma processing method of example 1, where the first plurality of DC pulses each include a first frequency, a first amplitude, and a first duty cycle.

Example 3. The plasma processing method of one of examples 1 or 2, where the second plurality of DC pulses each include a second frequency, a second amplitude, and a second duty cycle.

Example 4. The plasma processing method of one of examples 1 to 3, where the AC waveforms are sine waves including a third frequency, and a third amplitude.

Example 5. The plasma processing method of one of examples 1 to 4, where the first frequency is equal to the second frequency, and the third frequency is at least an order of magnitude larger than the first frequency and the second frequency.

Example 6. The plasma processing method of one of examples 1 to 5, where the third frequency is in the range between about 1 MHz and 100 MHz.

Example 7. The plasma processing method of one of examples 1 to 6, where the absolute value of the first amplitude is smaller in magnitude than the absolute value of the second amplitude, and the first amplitude and the second amplitude are the same polarity.

Example 8. The plasma processing method of one of examples 1 to 7, where the first amplitude and the second amplitude are negative voltages.

Example 9. The plasma processing method of one of examples 1 to 8, where the third amplitude is smaller in magnitude than the second amplitude, and the third amplitude is a peak-to-peak voltage.

Example 10. The plasma processing method of one of examples 1 to 9, where the second on-state of each of the second plurality of DC pulses is contained within the first off-state of each of the first plurality of DC pulses.

Example 11. A plasma processing method includes providing a first pulse train including a first plurality of DC pulses to a top electrode in a plasma chamber. And the plasma processing method further includes providing AC waveforms and a second pulse train including a second plurality of DC pulses to a bottom electrode in the plasma chamber, where a second time duration that is the length of time of each of the on-states of the DC pulses of the second plurality of DC pulses is contained within the off time duration that is the length of time of each of the off-states of the DC pulses of the first plurality of DC pulses such that the off-states of the first pulse train align with the on-states of the second pulse train.

Example 12. The plasma processing method of example 11, where the first pulse train includes a first frequency, a first amplitude, and a first duty cycle.

Example 13. The plasma processing method of one of examples 11 or 12, where the second pulse train includes a second frequency, a second amplitude, and a second duty cycle.

Example 14. The plasma processing method of one of examples 11 to 13, where the AC waveforms are sine waves including a third frequency, and a third amplitude.

Example 15. The plasma processing method of one of examples 11 to 14, where the first frequency is equal to the second frequency, and the third frequency is an order of magnitude larger than the first frequency and second frequency.

Example 16. The plasma processing method of one of examples 11 to 15, where the third frequency is in the range between about 1 MHz and 100 MHz.

Example 17. The plasma processing method of one of examples 11 to 16, where the absolute value of the first amplitude is smaller in magnitude than the absolute value of the second amplitude, and the first amplitude and the second amplitude are the same polarity.

Example 18. The plasma processing method of one of examples 11 to 17, where the first amplitude and the second amplitude are negative voltages.

Example 19. The plasma processing method of one of examples 11 to 18, where the third amplitude is smaller in magnitude than the second amplitude, and the third amplitude is a peak-to-peak voltage.

Example 20. A plasma processing system includes a plasma chamber, a top electrode and a bottom electrode, a first DC pulse generator coupled to the top electrode and configured to generate a first pulse train, and a second DC pulse generator coupled to the bottom electrode and configured to generate a second pulse train. The plasma processing system further includes a function generator coupled to the bottom electrode and configured to generate an AC waveform. And the plasma processing system further includes a controller coupled to and configured to control the outputs of the first DC pulse generator, the second DC pulse generator, and the function generator, the controller being configured to phase lock the first pulse train with the second pulse train.

Example 21. The plasma processing system of example 20, further includes a reference clock coupled between the first DC pulse generator and the second DC pulse generator, where the reference clock is configured to provide a signal to synchronize the outputs of the first DC pulse generator and the second DC pulse generator.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended the appended claims encompass any such modifications or embodiments.

What is claimed is:

1. A plasma processing method comprising:
   continuously applying AC waveforms to a bottom electrode in a plasma chamber to generate a plasma;
   while continuously applying the AC waveforms to the bottom electrode, applying a first pulse train comprising a first plurality of DC pulses to a top electrode in the plasma chamber, wherein each DC pulse of the first plurality of DC pulses comprises a first on-state and a first off-state, the first on-state accelerating ions of the plasma towards the top electrode to form secondary electrons, the first off-state repelling ions of the plasma from the top electrode; and
   while continuously applying the AC waveforms to the bottom electrode, applying a second pulse train comprising a second plurality of DC pulses to the bottom electrode in the plasma chamber, wherein each DC pulse of the second plurality of DC pulses comprises a second on-state and a second off-state, the second on-state accelerating ions of the plasma towards a substrate disposed on the bottom electrode to process the substrate, the second off-state enabling the secondary electrons to neutralize charge build up on the substrate, the first pulse train being offset in phase relative to the second pulse train so that each first off-state overlaps with each second on-state.

2. The plasma processing method of claim 1, wherein the first plurality of DC pulses each comprise a first frequency, a first amplitude, and a first duty cycle.

3. The plasma processing method of claim 2, wherein the second plurality of DC pulses each comprise a second frequency, a second amplitude, and a second duty cycle.

4. The plasma processing method of claim 3, wherein the AC waveforms are sine waves comprising a third frequency, and a third amplitude.

5. The plasma processing method of claim 4, wherein the first frequency is equal to the second frequency, and the third frequency is at least an order of magnitude larger than the first frequency and the second frequency.

6. The plasma processing method of claim 4, wherein an absolute value of the first amplitude is smaller in magnitude than the absolute value of the second amplitude, and the first amplitude and the second amplitude are a same polarity.

7. The plasma processing method of claim 4, wherein the first amplitude and the second amplitude are negative voltages.

8. The plasma processing method of claim 4, wherein the third amplitude is smaller in magnitude than the second amplitude, and the third amplitude is a peak-to-peak voltage.

9. The plasma processing method of claim 1, wherein the second on-state of each of the second plurality of DC pulses is contained within the first off-state of each of the first plurality of DC pulses.

10. The plasma processing method of claim 1, wherein more than 80% of a duration of each instance of the first off-state overlaps with each instance of the second on-state.

11. A plasma processing method comprising:
   providing a first pulse train comprising a first plurality of DC pulses to a top electrode in a plasma chamber; and
   providing AC waveforms and a second pulse train comprising a second plurality of DC pulses to a bottom electrode in the plasma chamber, the AC waveforms continuously generating a plasma in the plasma chamber, the second pulse train controlling the plasma to process a substrate disposed on the bottom electrode, wherein a second time duration that is a length of time of each on-state of the second plurality of DC pulses is contained within an off time duration that is the length of time of each off-state of the first plurality of DC pulses such that each off-state of the first pulse train aligns with each on-state of the second pulse train.

12. The plasma processing method of claim 11, wherein the first pulse train comprises a first frequency, a first amplitude, and a first duty cycle.

13. The plasma processing method of claim 12, wherein the second pulse train comprises a second frequency, a second amplitude, and a second duty cycle.

14. The plasma processing method of claim 13, wherein the AC waveforms are sine waves comprising a third frequency, and a third amplitude.

15. The plasma processing method of claim 14, wherein the first frequency is equal to the second frequency, and the third frequency is an order of magnitude larger than the first frequency and the second frequency.

16. The plasma processing method of claim 14, wherein an absolute value of the first amplitude is smaller in magnitude than the absolute value of the second amplitude, and the first amplitude and the second amplitude are a same polarity.

17. The plasma processing method of claim 14, wherein the first amplitude and the second amplitude are negative voltages.

18. The plasma processing method of claim 14, wherein the third amplitude is smaller in magnitude than the second amplitude, and the third amplitude is a peak-to-peak voltage.

19. A plasma processing system comprising:
   a plasma chamber;
   a top electrode and a bottom electrode;
   a first DC pulse generator coupled to the top electrode and configured to generate a first pulse train;
   a second DC pulse generator coupled to the bottom electrode and configured to generate a second pulse train to control a plasma to process a substrate disposed on the bottom electrode;
   a function generator coupled to the bottom electrode and configured to generate an AC waveform to generate the plasma independent of the first pulse train and the second pulse train; and
   a controller coupled to and configured to control outputs of the first DC pulse generator, the second DC pulse generator, and the function generator, the controller being configured to phase lock the first pulse train with the second pulse train.

20. The plasma processing system of claim 19, further comprising a reference clock coupled between the first DC pulse generator and the second DC pulse generator, wherein the reference clock is configured to provide a signal to synchronize the outputs of the first DC pulse generator and the second DC pulse generator.

* * * * *